United States Patent [19]
Weigl

[11] Patent Number: 5,673,213
[45] Date of Patent: Sep. 30, 1997

[54] ADAPTIVE FILTER

[76] Inventor: Konrad Michael Weigl, Friedenspromenada 1a, Munich, Germany, 81827

[21] Appl. No.: 704,358

[22] Filed: Aug. 28, 1996

Related U.S. Application Data

[63] Continuation of Ser. No. 244,062, filed as PCT/EP93/02324, Aug. 27, 1993, abandoned.

[30] Foreign Application Priority Data

Sep. 16, 1992 [DE] Germany ............................ 42 31 005.9
Aug. 6, 1993 [DE] Germany ............................ 43 26 487.5

[51] Int. Cl.$^6$ .................................................. G06F 17/10
[52] U.S. Cl. ............................................ 364/724.19
[58] Field of Search ........................ 364/724.19, 724.01

[56] References Cited

U.S. PATENT DOCUMENTS 5,278,780 1/1994 Eguchi ............................. 364/724.19

Primary Examiner—David H. Malzahn
Attorney, Agent, or Firm—Darby & Darby

[57] ABSTRACT

An adaptive filter for the approximation of a read-in set function F in a function space, containing a set of elementary filters $g_b$, n being an integer $\geq 1$. The elementary filters cover a sub-space in the function space, the parameters of the elementary filter are changable and the filter performs the following operation: calculating the normal projections of the set function F on each elementary filter and multiplying the normal projection quantities $A_a$ thus obtained by the contra-variant metric tensor $G^{ab}$ formed from the set of the elementary filters in order thereby to obtain the projection of the set function F on the sub-space covered, whose difference D from the set function F is determined as a function of the elementary filter and the metric tensor in accordance with the formula (I) in order thereby to minimise the difference D by changing the elementary filter parameters by means of conventional deterministic (e.g. "gradient fall method") or stochastic (e.g. simulated annealing, "Monte-Carlo method") methods of calculation, the desired approximated function being obtained from the superimposition of the elementary filters set by minimization in accordance with the formula (II).

18 Claims, 15 Drawing Sheets

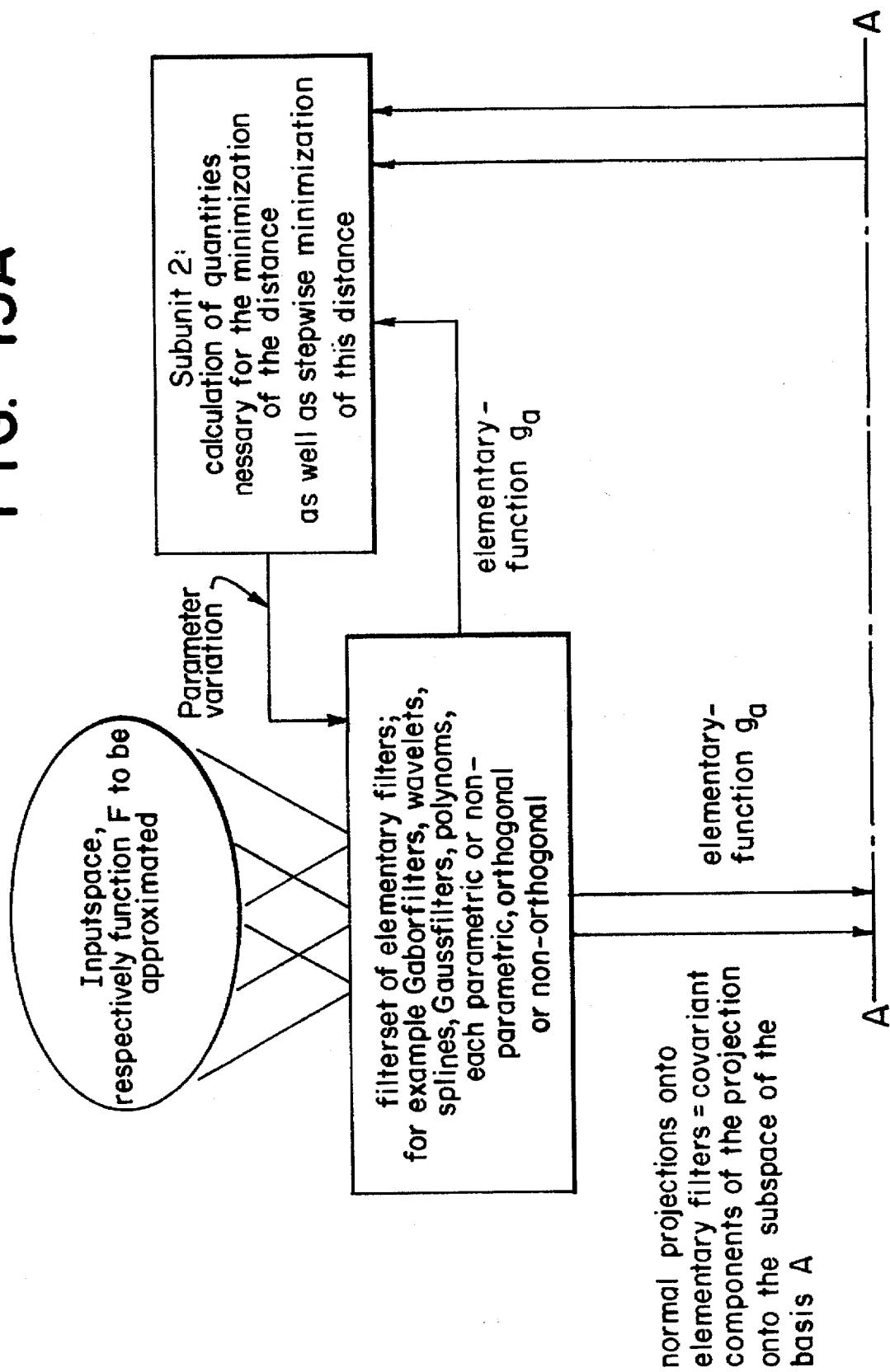

ADAPTIVE FILTER

This is a continuation of application Ser. No. 08/244,062, filed as PCT/EP93/02324, Aug. 27, 1993, now abandoned.

FIELD OF THE INVENTION

The present invention relates to an adaptive filter for approximating a set value function F.

The present invention relates in particular to an adaptive filter which is able to approximate a given set value function in order to handle therethrough complicated functions more easily and to provide them with a reduced information bandwidth for further processing steps.

The present invention relates also to special devices and methods which become possible with such a filter, whereby these methods and devices concern primarily the area of pattern recognition.

BACKGROUND OF THE INVENTION

FIG. 14 shows in which manner a predetermined set value function F may be approximately described by the bandwidth-saving approximated function $F_{app}$.

The finding of approximated solutions conventionally involved a huge calculation effort, and the thus found approximated solutions were often not sufficiently accurate.

It is therefore the object of the present invention to provide an apparatus which enables the simple approximation of a predetermined set value function which has, despite a considerable reduction of bandwidth, a sufficient accuracy.

The present invention has the further object of providing devices and methods in the area of pattern recognition which devices have become possible with the above-mentioned apparatus, which however, themselves contain additional inventive particulars.

The advantage of the specific adaptive filter can be seen in its capbility to orientate its elementary filters in such a manner that an optimal description of a predetermined set function F is achieved. The approximated function found by the filter describes the predetermined set function F in a representation which may be more easily handled in the further processing and which has a drastically reduced information bandwidth.

The preferred embodiment comprises a plurality of elementary filter sets, each set spanning a sub-space, leads to an increased speed for the approximation, thereby retaining the advantage of the high calulation speed.

The preferred embodiment has the additional advantage that the determination, which of the projections onto the several sub-spaces constitutes the best approximation of the set function, can be carried out in a particularly elegant and time saving manner.

Preferably the adaptive filter according to the present invention comprises elementary filters which are defined by Gauß-, Gabor-, Sigmoid- or tanh-functions. Such filter types can mathematically, be easily expressed and handled.

In a further preferred embodiment of the adaptive filter according to the present invention, all elementary filters are linear independent, leading to the advantage of a low calculation effort.

The set function F to be approximated is preferably read-in discrete in regard to both, the value range as well as the resolution thereby enabling digital processing of the result in conventional microprocessors. Self-evidently, processing of a continuous function is also possible with the inventive filter, for example in the case that the set function is an optical signal.

For certain applications is may be advantageous to output the parameters of the elementary filters at least after the finding of the approximated function, in order to provide them for further processing steps.

According to a further preferred embodiment, in case of an incomplete detected set value function, the respective gaps are approximated by the function values in the surrounding of the gaps and an additionally offset of addative noise. Thereby the missing function values are properly approximated with a high probability, in that the filter adjustment is practically not influenced by the originally missing function values. This leads possibly to the same result, which would have been acheived with a complete predetermined set value function. This would not have been the case if the missing function values were preset to the value zero.

The calculation method used for minimizing the difference between the projection and the set function F is preferably a gradient fall descent method (a deterministic method), which leads to a fast minimization of the difference.

According to a further preferred embodiment the set fucntion F may be an optical signal, for example an image scanned by a television camera. The adaptive filter according to the present invention is paricularly suitable for optical applications, since in regard to such applications huge amounts of information have to be reduced as far as possible for the subsequent transmission. In this connection it should be clear, that the set fucntion may also be an electric video- or audio- signal.

In case of video signal and optical signals the elementary filters may be optical filters.

Finally, according to a further preferred embodiment, the adaptive filter may be designed in that a bandwidth reduced HDTV-signal is output as the approximated function.

Further preferred embodiments are the subject matter of the dependent claims.

BRIEF DESCRIPTION OF THE DRAWINGS

In the following, a preferred embodiment of the present invention will be explained in detail in compliance with the attached drawings in which:

FIGS 15A and 15B a further flow chart of a calculation used by the filter.

DETAILED DESCRIPTION OF THE INVENTION

As it is known, under the assumption of an orthogonal coordinate system, a given vector may be represented by a vector addition of its projections onto each of the axes of the space. If the axes spanning (defining) the space are no longer orthogonal to each other, this relation is no longer true as may be derived as seen from FIG. 2.

The non-orthoganal axes pair $g_0$, $g_1$ spans (defines) a two-dimensional space in which the vector A is contained. Vector addition of the two projections $A_0$, $A_1$ of the vector A onto the axes $g_o$, $g_1$ will lead to another vector as original vector A. In order to obtain vector A again, a multiplication of each of the projections with the so called contra-variant metric tensor is necessary, which metric tensor may be formed by inverting the co-variant metric tensor defined by the basis vectors $g_0$, $g_1$.

Figure 2:
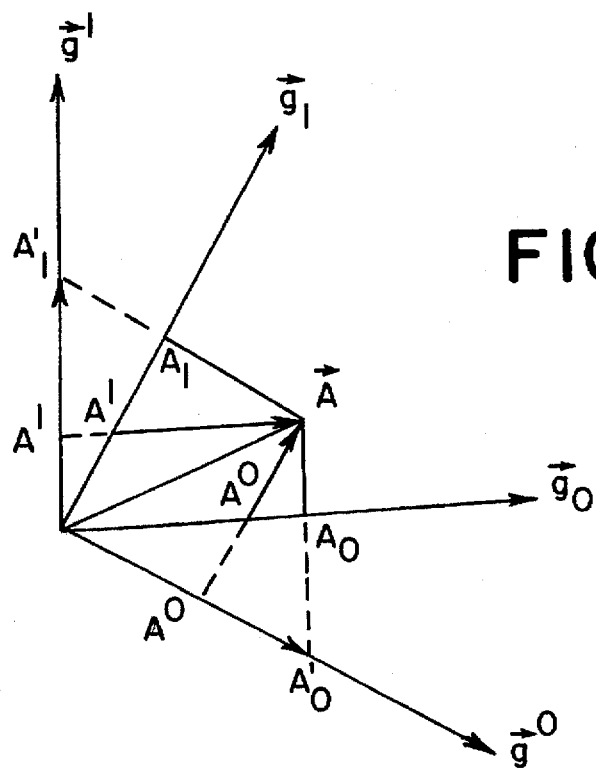
FIGS. 2 and 3 are vector diagrams for explaining the mathematical principle underlying the present invention.

The multiplication of the basis vectors $g_0$, $g_1$ with the contra-variant metric tensor (in the following characterized by the symbol $g^{ab}$) leads to a scaling of the original projections $A_0$, $A_1$ as this is indicated in FIG. 2 by the shorter projections $A^0$, $A^1$. The addition of these projections weighed by the metric tensor, leads again to original vector A.

This operation may mathematically be expressed as follows:

$$A = \sum_a \sum_b A_a g^{ab} g_b \qquad (1)$$

wherein $A_a$ is the projection of the vector A onto the basis vectors $g_a$ which are obtained mathematically through scalar multiplication.

FIG. 3, once again shows an original function F (set value function) and a basis vector $g_o$, $g_1$. Since the shown space has three dimensions, the basis $g_o$, $g_1$ defines merely a two-dimensional sub-space therein. The projection of the set function (set-vector) F onto this sub-space leads again to vector A. This projection is obtained in the manner mentioned above by vector adding the projections of the set function F onto the two basis vectors $g_o$, $g_1$ weighted by the counter-variant metric tensor of the basis vectors. Vector addition of the two weighted projections $A^o$, $A^1$ lead to the projection A of the function F onto the subspace defined by the basis $g_o$, $g_1$.

Also in that case the projection A can be described by the formula of equation (1), if the projection of the set function F onto the basis vectors (obtainable for example by scalar multiplication) is used for the normal projection $A_a$.

The projection A differs by the dotted indicated difference D from the original function F. This may be expressed by the following relationship:

$$D = F - \sum_a \sum_b A_a g^{ab} g_b \qquad (2)$$

whereby $A_a$ signifies again the projections of the original function F onto the basis vectors $g_o$, $g_1$.

It has to be noted, that the formula of equation (2) is only valid for euclidic and non-crooked spaces and that for other spaces a respective amended distance function has to be used. Thus equation (2) reads generally:

$$D = f\left( F; \sum_a \sum_b A_a g^{ab} g_b \right) \qquad (2')$$

Figure 3:
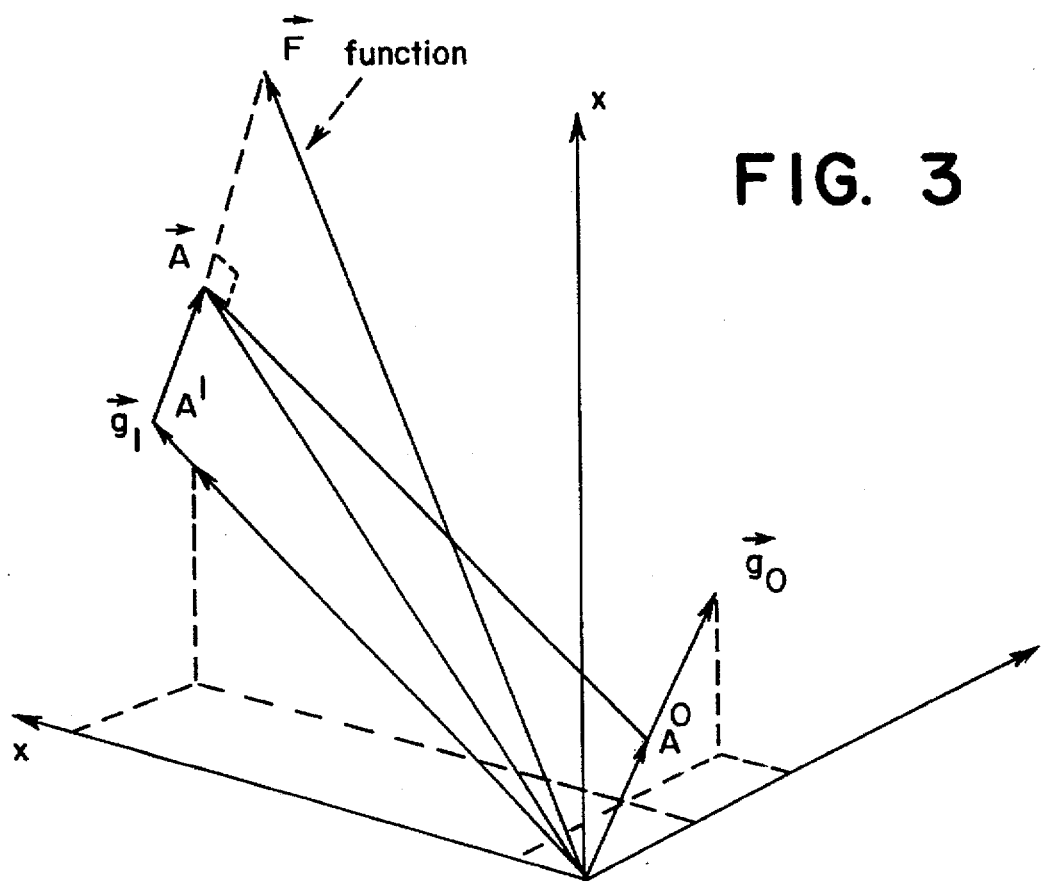

The difference of the projection A from the function F as expressed by formula (2), may, under the assumption of rotatable basis vectors $g_o$, $g_1$ vectors, be minimized by known mathematical methods, for example accordig to the gradient fall (descent method). Figuratively this may be explained as a rotation of the sub-space defined by $g_o$, $g_1$ and the therein con-tained projection A in a direction to original function F until projection A finally is in concurrence with the original function F. During the upward rotation of the sub-space, the representations of the basis vectors, the representation of the contra-variant metric tensor calculated from the basis vectors and the projections of the function F onto the each basis vector are changed (FIG. 3 shows projections $A^o$, $A^1$ already weighted with the metric tensor).

The calculation of projection A under use of the metric tensor as explained above, concerns however only a specific embodiment of the present invention. In the following, further specific embodiments of the adaptive filter according to the present invention will be explained, before finally the general description of the adaptive filter according to the present invention which is given.

This abstraction of the present invention covers all embodiments of the adaptive filter, which are derivable for the skilled man when studying the several explained specific embodiments.

For a better understanding attention is drawn once again to FIG. 2. FIG. 2 not only shows the basis vector pair $g_o$, $g_1$, but also the biorthogonal adjoined basis pair $g^o$, $g^1$. Obviously vector A may not only be represented by vector addition of the weighted projections $A^0$, $A^1$, but also by the two further indicated vectors $A_o$, $A_1$, along the adjoined basis $g_0$, $g_1$, whose normal projections onto the basis $g_0$, $g_1$ are also $A_0$, $A_1$. Related to the calculation of projection A in the spanned (defined) sub-space, these two basic possibilities may be expressed as:

$$A = \sum_a A^a \bar{g}_a \text{ with } A^a = \sum_b g^{ab} A_b \qquad (3)$$

$$A = \sum_a A_a \bar{g}^a \text{ with } g_b = \sum_a g^{ba} \cdot \bar{g}_a \qquad (4)$$

More simple spoken, it is also possible to express the projection A as the sum of multiplications of the contra-variant components $A^a$ with its respective basis vectors $g_a$, whereby the contra-varient components in this case are calculated by use of metric tensor $g^{ab}$ or as the sum of the multiplications of the normal projections $A_a$ with its resepctive biothogonal adjoined bases $g^a$, wherein the biorthogonal adjoined bases are in this case calculated under use of metric tensor $g^{ba}$.

Figure 13A:
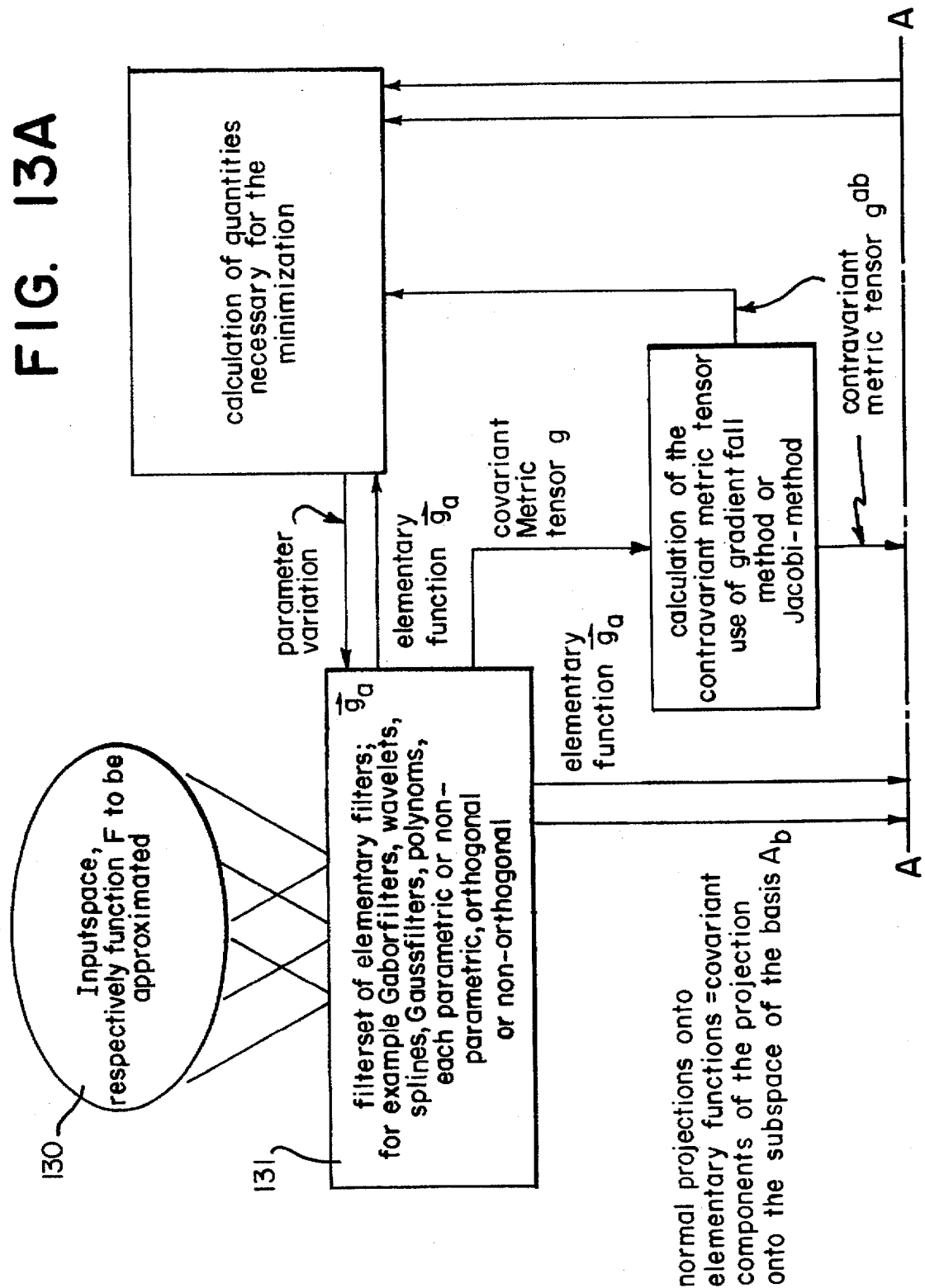
FIGS. 13A and 13B a flow chart of a calculation used by the filter.
Figure 13B:
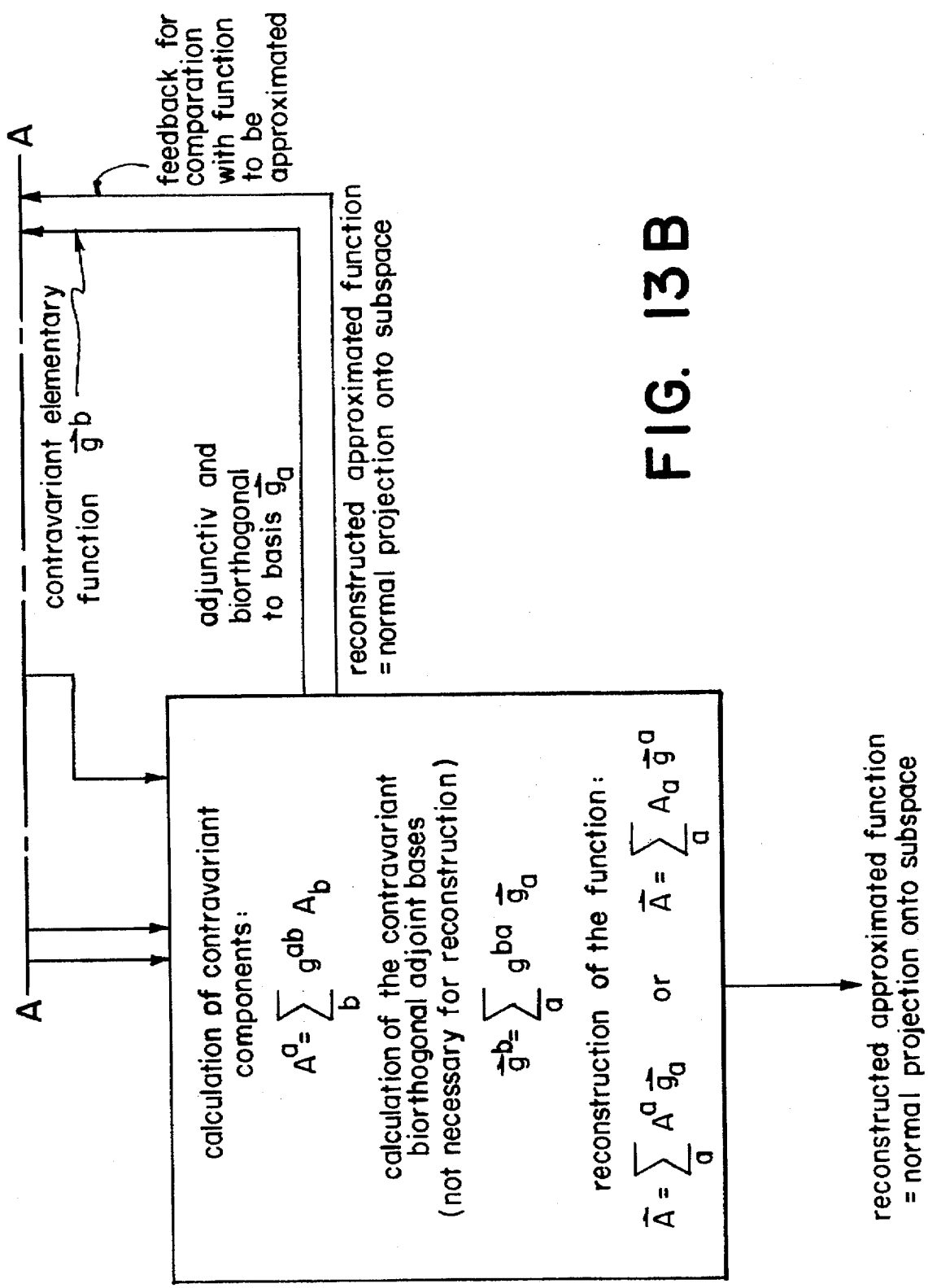
Figure 14:
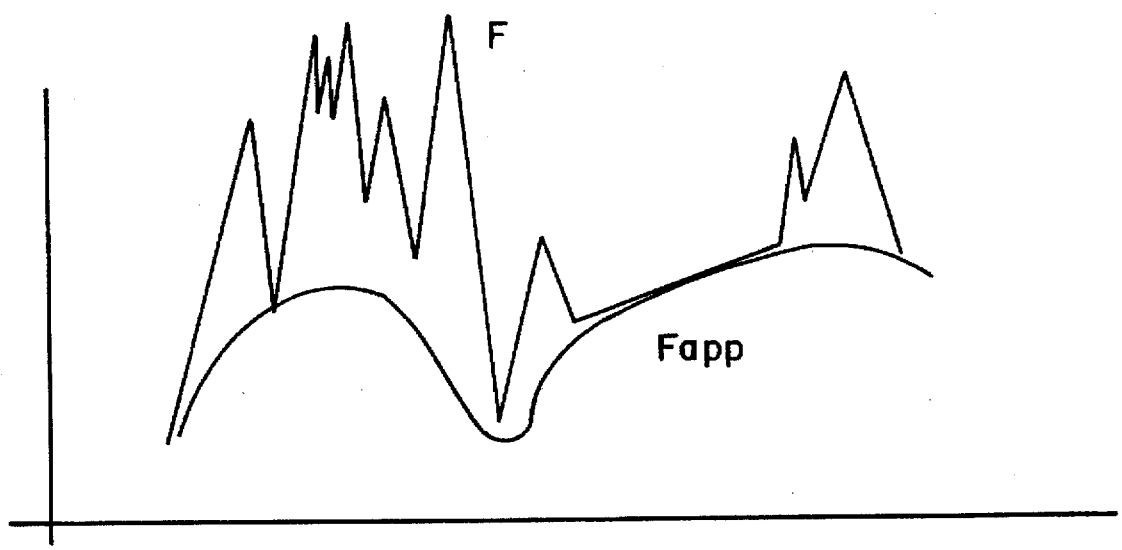
FIG. 14 is a general example in which manner a set function with a large bandwidth may be described by an approximated function containing less information.

In the following these two cases are referred to as main case 1 and main case 2. In connection with FIG. 13 these relationships will be further explained whereby the respective formulas are explicitly stated in Block 132 of FIG. 13.

The use of the contra-variant metric tensor for the calculation, of projection A is not absolutely necessary and constitutes as already mentioned above, only a preferred embodiment of the present invention. Although the use of the metric tensor leads to a mathematically elegant calculation of the projection A, other calculation methods for the projection A which do not need the metric tensor have the advantage that the high calculation effort for the inversion of the co-variant metric tensor to obtain the contra-variant metric tensor is not necessary. Since the inversion of the co-variant metric tensor has to be conducted for each step of rotation of axes pair $g_0$, $g_1$ the inversion leads, in particular in relation with tensors having a plurality of dimensions, to a hugh calculation effort. As an example of a calculation method according to a further preferred embodiment of the adaptive filter a method is explained in the following, which does not need the contra-variant metric tensor.

Since the projection of the vector A onto the basis vector $g_a$ may be explained as follows:

$$A_a = \sum_b g_{ba} A^b \tag{5}$$

wherein $g_{ba}$ indicates the co-variant metric tensor, it follows:

$$A_a - \sum_b g_{ba} A^b = 0 \tag{6}$$

Thus, by minimization of this distance function, the unknown weighted projection $A^b$ may be found. Mathematically this may be expressed as follows:

$$\left( A_a - \sum_b g_{ba} A^b \right) \text{ minimal}$$
$$\Rightarrow \left( A_a - \sum_b g_{ba} A^b \right)^2 \text{ minimal} \tag{7}$$

Thus for all a it may be written:

$$\Rightarrow E = \sum_a \left( A_a - \sum_b g_{ba} A^b(t) \right)^2 \text{ minimal}$$

whereby A(t) now stands for a time varying value or set of values which have to be changed to make E as small as possible.

This may be achieved for example through a classic gradient fall (descent) method: if for all σ:

$$\frac{dA^a(t)}{dt} = -\frac{dE}{dA^a} = -\frac{d \sum_a \left( A_a - \sum_b g_{ba} A^b(t) \right)^2}{d \cdot A^a} =$$
$$+2 \left( \sum_a \left[ \left( A_a - \sum_b g_{ba} A^b(t) \right) \cdot g_{ba} \right] \right)$$

A(t) changes as long as $$\frac{dA^b}{bt} = 0$$

is reached or the "energy" E falls below a certain set value.

This is the case when Aσ (t) is close to the value A which is searched.

Thus the representation of the projection A may be found also without the use of the contra-variant metric tensor solely by minimization of of the distance function.

According to FIG. 2, the minimization method may be explained. The normal projections $A_0$, $A_1$ onto the basis pair $g_0$, $g_1$ are known. The minimization method achieves that any vector $A^{0'}$, $A^{1'}$, in the direction of the the basis vectors $g_0$, $g_1$ is adjusted in length until the normal projection of their addition A' is equal to the projections $A_0$, $A_1$, of the searched vector A onto the basis vector $g_0$, $g_1$. A vector A' which satisfies this condition is exactly the searched vector A', so that the lengths of the respectively changed vectors $A^{0'}$, $A^{1'}$, the vector addition of which results in vector A', corresponding to the searched weighted projections $A^0$, $A^1$.

Instead of starting from formula (5), it is also possible to start the minimization method from the following equation:

$$D = \left( F - \sum_b A^b g_b \right)^2 \tag{8}$$

This equation may be minimized by a differential operation according to A' explained herein below:

$$\frac{dA^a(t)}{dt} = -\frac{dD}{dA^a} = -2 \left( F - \sum_b A^b(t) g_b \right) \frac{d\left( -\sum_b A^b(t) - g_b \right)}{dA^a} = \tag{9}$$
$$+2 \left( F - \sum_b A^b(t) g_b \right) g_a$$

Figuratively speaking, the difference between a minimization according to formula (5) and a minimization according formula (8) can be seen in that in case of formula (8), a minimization of the distance between the set fuction F and the vector addition of the weighted components is carried out, whereas in case of the method according to equation (5), a minimization of the distance between the normal projections of the set function F onto the basis vectors and the respective normal projections of the vector A' onto the basis vectors is carried out. As a further possibility for calculating the projection A, the following alternative method is presented.

The quantity $A^a$ is calculated alternatively, wherein iteration is carried out on the set of examples.

The quantities $A^a$ are calculated by deriving the new value from the respective previously calculated value. The advantage of the method may be seen in that it is not necessary to store all examples but to read-in them one by one.

The equation reads:

(1) $A^a(t) = A^a(t-1) + g^a(t)E(t)$ \hfill (10)

(2) $g^a(t) = \sum_b g^{ab}(t) \cdot g_b(t)$ (3) $E(t) = F(t) - \sum_b A^b(t-1) g_b(t-1)$ wherein the contra-variant metric tensor may, for example, be calculated as follows:

$$g^{ab}(t) = g^{ab}(t-1) - \frac{\sum_k \sum_L [g^{ak}(t-1)g_{kl}(t)g^{Lb}(t-1)]}{\left[ 1 + \sum_a \sum_b g_a(t) g^{ab}(t-1) g_b(t) \right]}$$

therefrom it follows: 10b $$g^a(t) = \sum_b g^{ab}(t-1) g_b(t) / \left[ 1 + \sum_a \sum_b g_a(t) g^{ab}(t-1) g_b(t) \right]$$

The two calculation methods explained above as well as the calculation method described in the beginning using the metric tensor belong all to main case 1 as introduced above, i.e. within these methods the weighted components $A^a$ are calculated, although for each method in a different way.

In the following respective methods concerning main case 1 will be explained i.e. within the following methods the calculation of the adjoined bases is most important.

One method belonging to this group of methods is based on the calculation of the adjoined bases with the help of the counter-variant metric tensor. This can be expressed by the following equation:

$$g^b = \sum_a g^{ba} \cdot g_a \tag{11}$$

wherein the searched projection A may be expressed in this case as:

$$\bar{A} = \sum_a A_a g^a \qquad (12)$$

This method corresponds with the first method described in regard to the first main group, in which the weighted components are calculated with the help of the contra-variant metric tensor. As mentioned above, these two corresponding methods are once again explicitly stated in Block 132 of FIG. 13.

A further method of this second main group, which does not need the counter-variant metric tensor, and which therefore does not require inversion of the contra-variant metric tensor in each step, is the following:

Starting from the relationship:

$$g_a = \sum_b g_{ab} g^b \qquad (13)$$

for calculating the unknown adjoined basis vector $g^a$ the following minimization is carried out:

$$g_a - \sum_b g_{ab} g^b(t) = \text{minimal}. \qquad (14)$$

Equivalently, may be written for all a:

$$E = \sum_a \left( g_a - \sum_b g_{ab} g^b(t) \right)^2 \text{minimal} \qquad (15)$$

whereby $g^b$ (t) is now a time variant quantity, which has to be changed in that the above-mentioned quantity E becomes as small as possible. $g^b$ (t) is now changed in that E is minimized which can be done again for example by the classic gradient fall method:

$$\frac{dg^a(t)}{dt} = -\frac{dE}{dg^a} = -\frac{d\left[ \sum_a \left( g_a - \sum_b g_{ab} g^b(t) \right)^2 \right]}{dg^a} = \qquad (16)$$
$$+ 2 \sum_a \left( g_a - \sum_b g_{ab} g^b(t) \right) g_{ab}$$

$g^a$ (t) changes until dg/dt is euqal zero or falls below a threshhold value or until the energy is smaller as a set value respectively; when this condition is fulfilled the resultant quantity $g^a$ (t) is near the searched quantity $g^a$, since error E is then at minimum.

This method corresponds thus with the second method described in regard to main group 1.

A further error function usable with the above method is the following:

$$D = \left( F - \sum_a A_a g^a(t) \right)^2. \qquad (2)$$

This function may be minimized in regard to ga:

$$\frac{dg^a(t)}{dt} = -\frac{dD}{dg^a} = -2\left( F - \sum_a A_a g^a(t) \right) \cdot \frac{d\left( -\sum_a A_a g^a(t) \right)}{dg^a} = \qquad (18)$$
$$+ 2\left( F - \sum_a A_a g^a(t) \right) A_b$$

A further possibility to calculate the counter-variant basis through a gradient fall method is possible by using the following equation:

$$g(t+1)^a = g(t)^a + \gamma \left( g(t)_a + \sum_b g_{ab} \cdot g(t)^b \right) \qquad (19)$$

As a third possibility an iterative method may be used as has been also described in regard to the first main case.

In the following, the general principle underlying all calculation methods will be explained:

The projection of set function F onto the sub-space spanned (defined) by the vectors $g_a$, $g_b$ corresponds to a solution of a classical problem of linear algebra which is referred to as the so-called "Least Squares"-problem. All of the solutions presented above are particular solutions of the following general equation:

$$MX = B \qquad (20)$$

whereby M is a known matrix, X the unknown vector, and B a known vector.

The dimension of the vector X is assumed to be smaller than the dimension of B and materix M has a dimension equal to the product of the dimension of X and the dimension of B.

The so formed equation system normally does not have an exact solution, because the amount of equations is greater than the amount of unknown quantities.

There are however also cases possible in which the dimension of X is greater or equal to the dimension of B. Also for these cases a solution may be found according to the following method. Using a method which generally is referred to as the "Least Squares" method in mathematics, a solution based on the smallest mathematical error may be found. Related to the present invention, B corresponds with the set function F, M corresponds to a matrix which is formed out of the counter end basis function $g_a$ by writing the basis functions as sequential columns and X corresponds with the vector of the unknown and searched contra-variant (weighted) components $A^a$. The materix-vector-product MX may be expressed as follows:

$$MX = \sum_a g_a A^a \qquad (21)$$

This corresponds to the projection A onto the sub-space. The projection A is therefore the "Least Squares" solution of the equation system.

Due to the shown general relationship it has to be emphasized that the present invention is not restricted to the use of the above explicitly mentioned calculation methods, but that the present invention covers any solution corresponding to a solution of the basic problem expressed by equations (20) and (21). Illustratively, it should be mentioned, that the first described method, which uses the metric tensor for the calculation may be expressed now as a solution of the so called normal equation on a direct way. This may be expressed by the following equation:

$$M^T M X = M^T B \rightarrow X = (M^T M)^{-1} M^T B \qquad (22)$$

Other solutions, which have not explicitly been described, which are however a solution of the general problem, are for example the so called "Singular Value Decomposition" method which is a further method for carrying out the matrix inversion.

For a better understanding of the above relationships, these relationships are once again explained in regard to FIG. 3.

The basic idea may be seen in that the projection A of the set function F into the spanned (defined) sub-space may be calculated bearing in mind that the currently calculated projection A' corresponds only in that case with to actual projection A of the set function F onto the sub-space, if this currently calculated projection A' posesses the same projections onto the spanned sub-space as the set function F. In other words, the set function F has the same projections onto the basis vectors as its actual projection A onto the sub-space, although the set function F is not contained in the spanned sub-space. All above mentioned methods according to main case 1 use this relationship to solve the following equation:

$$\sum_a g_a A'^a = F \qquad (23)$$

The Scalar multiplication of the set function F onto the monitored basis pair corresponds only in that case with the projection of the left term onto the monitored basis pair, if the left term corresponds with the search of projection A.

In particular, in regard to methods which do not use a contra-variant metric tensor and in regard to which in accordance with main groups 1 and 2 the quantities $A^a$, $g^a$ are already calculated by minimization methods as for example by the gradient fall method, it is advantageous to have two independent calculation modules within the inventive filter which interchange their calculated values with each other.

For example, a first sub-unit 1 would be responsible for the calculation of quantities $g^a$, $A^a$ resepctively. A further sub-unit 2 would then be responsible for the calculation of the deviation of the approximation of the said function from the set function itself. For the initialization of the filter, random values for the parameters of the filter $g_a$ would be inputted. Therefrom the filter would then calculate $g_a$, $A_a$.

With these values sub-unit 1 would iteratively or in another way calculate the values of $A^a$, $g^a$ respectively.

As soon as the respective values have been calculated, sub-unit 2 would conduct one or several steps for minimizing of the deviation. Therefrom new values would result for $g_a$, $A_a$.

Based on these new values sub-unit 1 would then again calculate new values for $A^a$, $g^a$ respectively, which would again be the basis for one or several steps of sub-unit 2.

This will continue iteratively until sub-unit 2 has converged and a perfect approximation for the set function has been found.

Sub-unit 2 would therefore always conduct one or several steps, while sub-unit 1 would completely converge each time. The method may also be conducted with the help of coupled differential equations whereby then the time constant of sub-unit 2 would be larger than that of sub-unit 1, in that sub-unit 1 could calculate faster.

Figure 4:
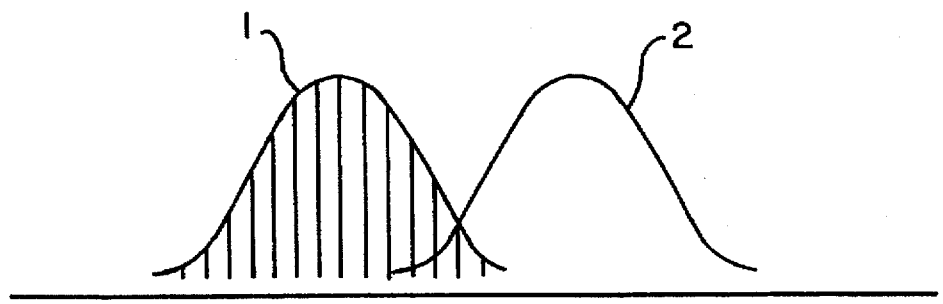
FIG. 4 shows the characteristics of an example of possible elementary filters.

Departing now from the figurative vector space shown in FIG. 3 and spanning (defining) the sub-space in a function space by a pair of shifted Gaussion filters, as this is shown in FIG. 4, the above-mentioned rotation of the basis defining the sub-space may be more easily understood.

Gaussion filters 1, 2 shown in FIG. 4 may be interpreted as filter functions of time or position. Instead of the Gaussion functions, each other function is possible, in particular also the so called Gabor function. The filters 1, 2 shown in FIG. 2 may also have multi-dimensions, for example two "hills" on a two- dimesional area.

A sub-space in the fucntion space may also be defined by filters 1,2, since the filters are linear independent, due to their displacement to each other. If these filters are assumed to be discrete, they may be represented by their vectors having a dimension corresponding to the resolution. If the resolution becomes infinite the respective vector has an infinite dimension, corresponding to an analog filter function. Further preferred elementary functions to be used for the present invention are discussed herein below.

If the set function F to be approximated is for example a "mountain" above a plane, the adaptive filter according to the present invention is able by use of two-dimensional Gaussianfilters, to model the mountain. This is done by shifting the Gaussian filters to the positions of the elevations of the mountain and by making them at those locations sharper or more truncated and more or less elongated by respective parameter variations. Such mountains may, for example be modeled by a thousand elementary Gaussian filters which are properly shifted and formed. For a simple mountain shape already some few elementary filters or even one elementary filter may be sufficient, to model the principle shape of the original function in suitable mannerfor the further processing. If the mountain is described by the adjusted elementary filters, the information bandwidth of the original function is drastically reduced onto some filter parameters.

Within this example the shifting and forming of the two-dimesional Gauβ filter corresponds with the rotation of the sub-vector space towards the original function F as explained in connection with FIG. 3. Within the relationship represented by formula (2), $g_a$ represents a two dimensional gaussion elementary filter. The projections of the original function F ("mountain") onto the elementary filters $A_a$, as well as the elementary filter themselves and the contra-variant metric tensor formed by them, depend on the parameters describing the elementary filters and are changed when shifting, rotating or changing the form of the elementary filters. The difference D may be minimized under use of conventional calculation methods which may be deterministic (gradient fall method) or stochastic ("simulated annealing", "Monte Carlo") as explained above. Thus the found minimization constitutes constitutes an optimal approximation of the original function which is expressed by the ajdusted elementary filters.

This minimization is carried out automatically, in that the adaptive filter according to the present invention converges towards the best approximation.

A set function is inputted into the adaptive filter which is automatically approximated by the filter structure by a function describable with elementary filters and which is then outputted. The approximated function is drastically reduced in bandwidth, leading to a plurality of applications which are further discussed herein below.

Figure 1:
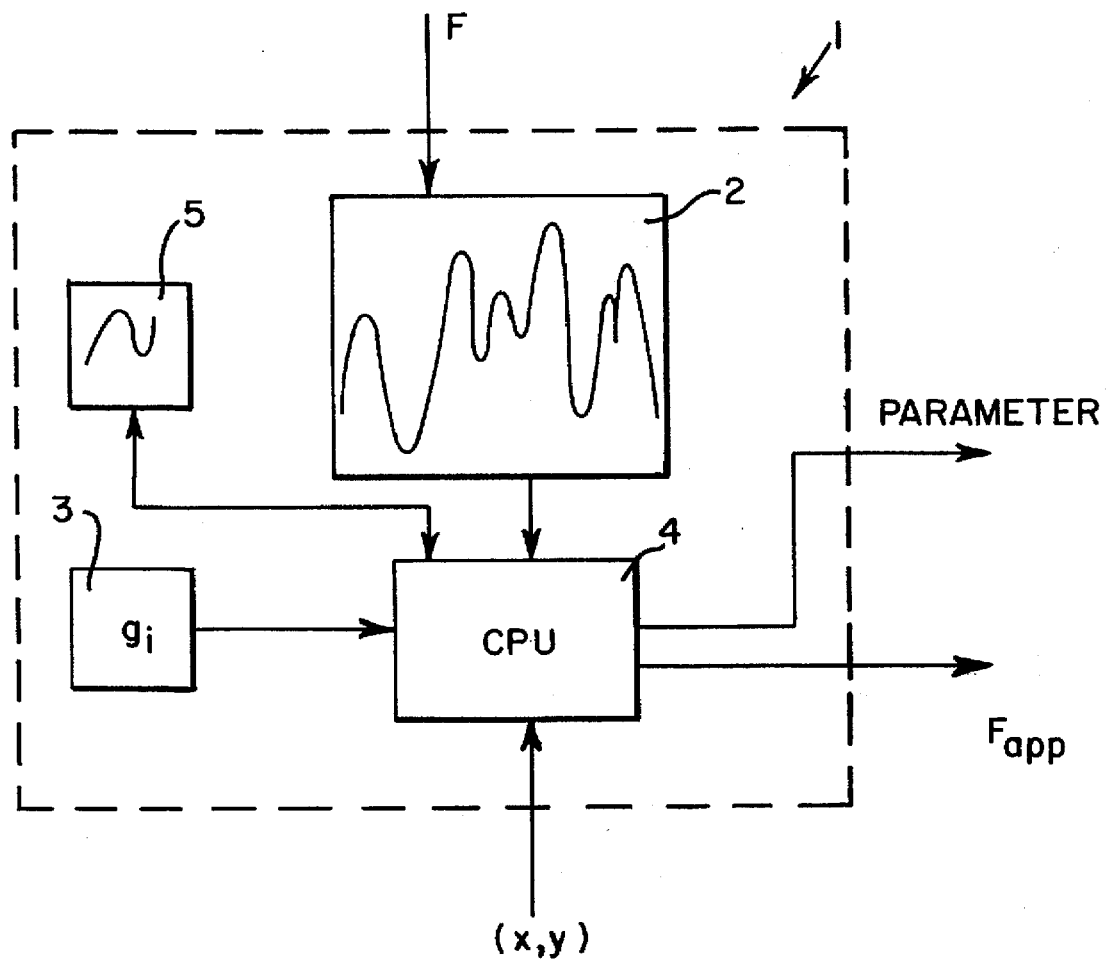
FIG. 1 is a block diagram of the inventive filter.

An embodiment of the inventive filter is schematically illustrated in FIG. 1. filter 1 reads the function F to be approximated into its memory 2. Further, filter 1 comprises a memory 3 in which at least one set of elementary filters is stored, which elementary filters are used for the approximation. Thereby a CPU 4 is able to calulate the normal projections of the function F onto the elemntary filters, (Scalar multiplication), and to carry out the calculation of the contra-variant metric tensor of the elementary filters, in that the difference D according to formula (2) can be represented in dependence from the filter parameters (average value, standard deviation etc.), which can then be minimized by use of a programmed minimization algorithm. After minimization has completed, the adaptive filter outputs the approximated, information reduced function $F_{app}$, which is used for the further processing. The approximated function corresponds to the substrabent in formula 2 after the minimization has been completed.

Filter 1 thereby has carried out a filter function automatically, namely to extract the desired essential components of the imput signal. In a further memory 5, the filter stores the found approximation, whereby the stored function values may be output value by value in response to further input signals (for example position coordinates X,Y).

The filter 1 may also approximate a plurality of set functions F and store them in memory 5. Thereby it is possible for the adaptive filter to compare a new set function after its approximation with already stored approximation functions (which is again possible with conventional mathematical methods), in order to detect that stored approximated function, which best correlates with the newly approximated function. In that manner pattern recognition is possible. In contrast to conventional pattern recogntion methods, the pattern recognition according the inventive adaptive filter has the advantage, that such a pattern recognition may be carried out with a considerably increased speed and that there are only low requirements for the functions to be classified, which is further explained in the following.

CPU 4 preferably provides the found filter parameters at a separate output, since these parameters are the essential classification features of an approximated function.

Figure 5:
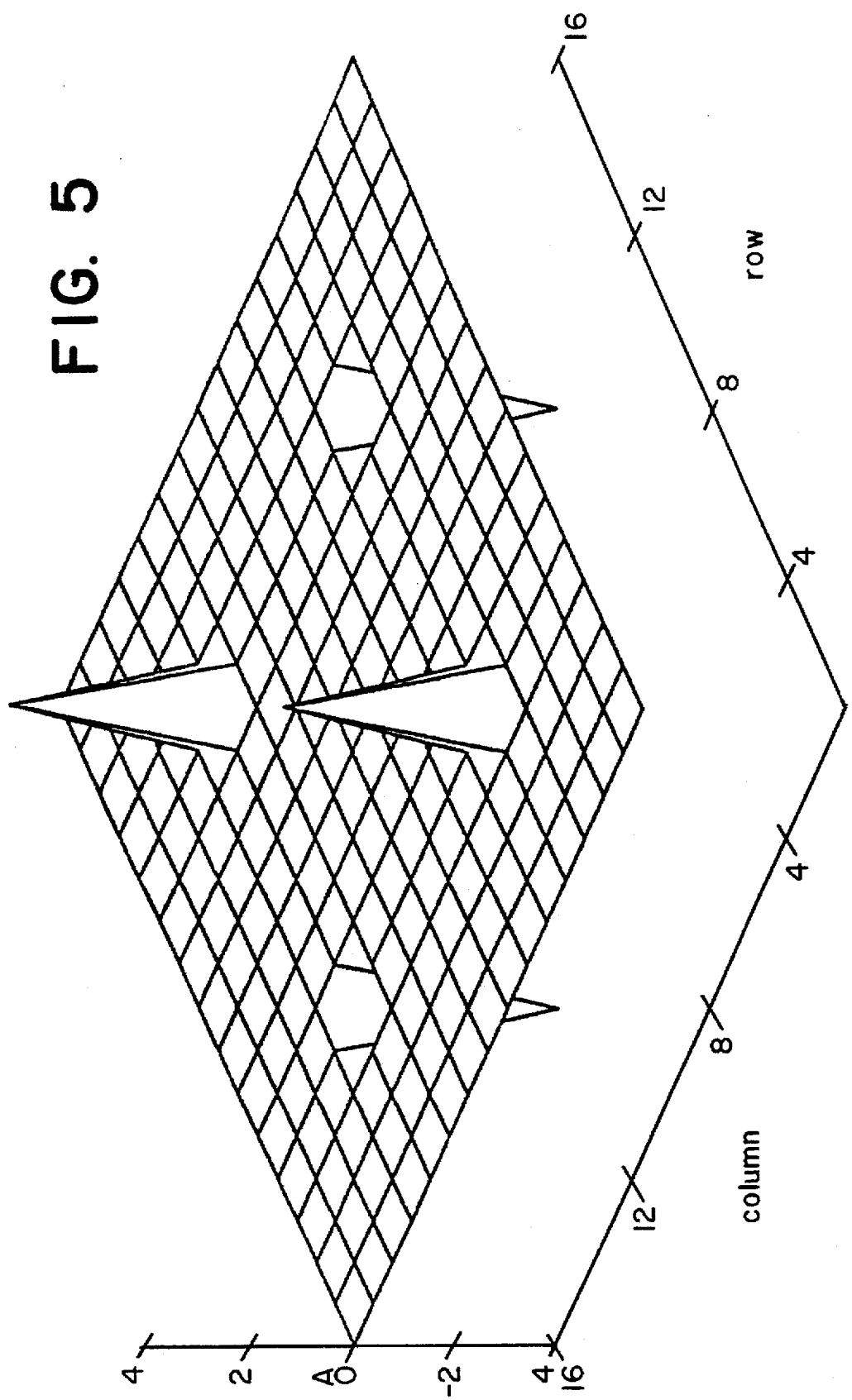
FIG. 5 shows the stepwise approximation of an XOR function
Figure 6:
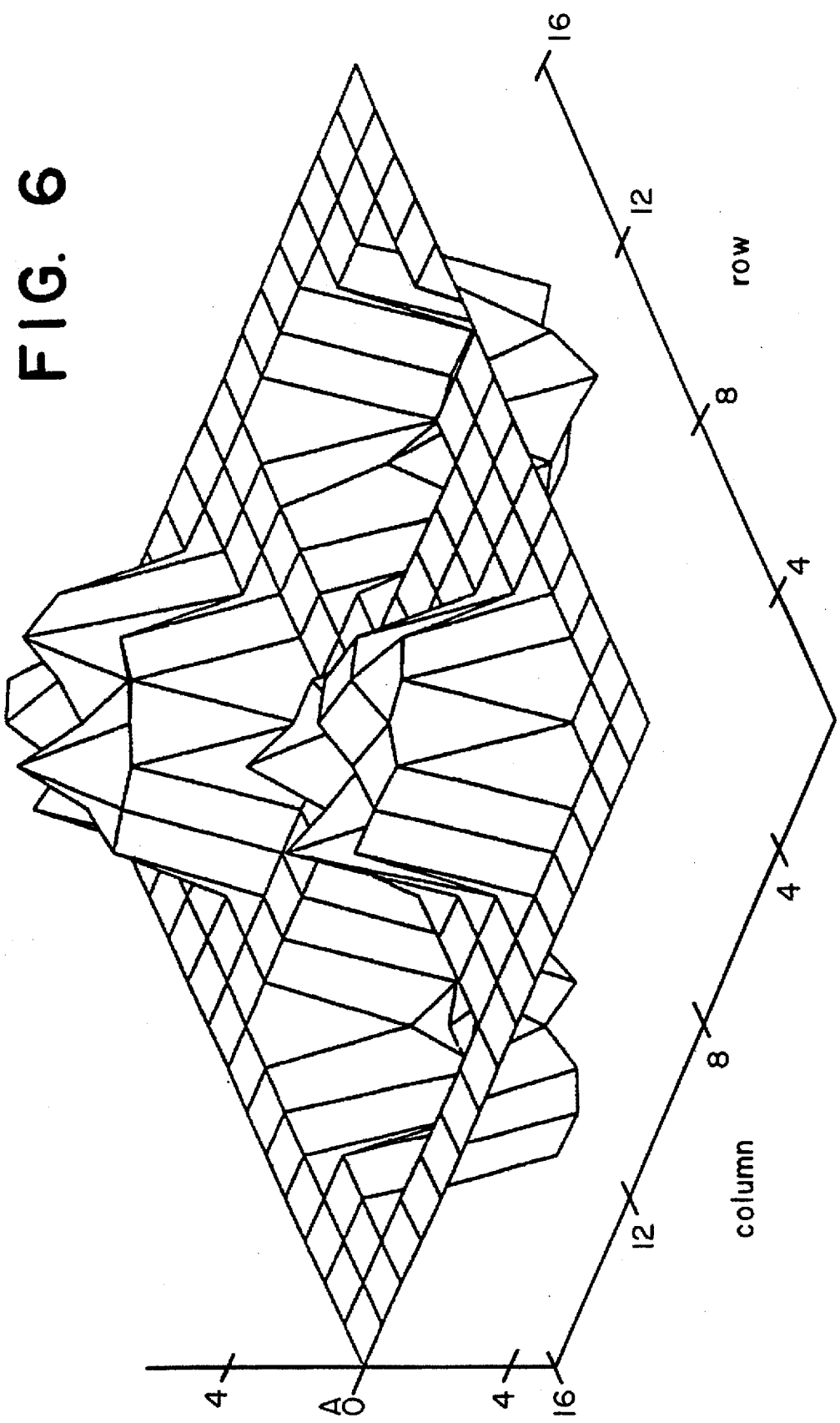
FIGS. 6–12 show a function developed through the filter.
Figure 7:
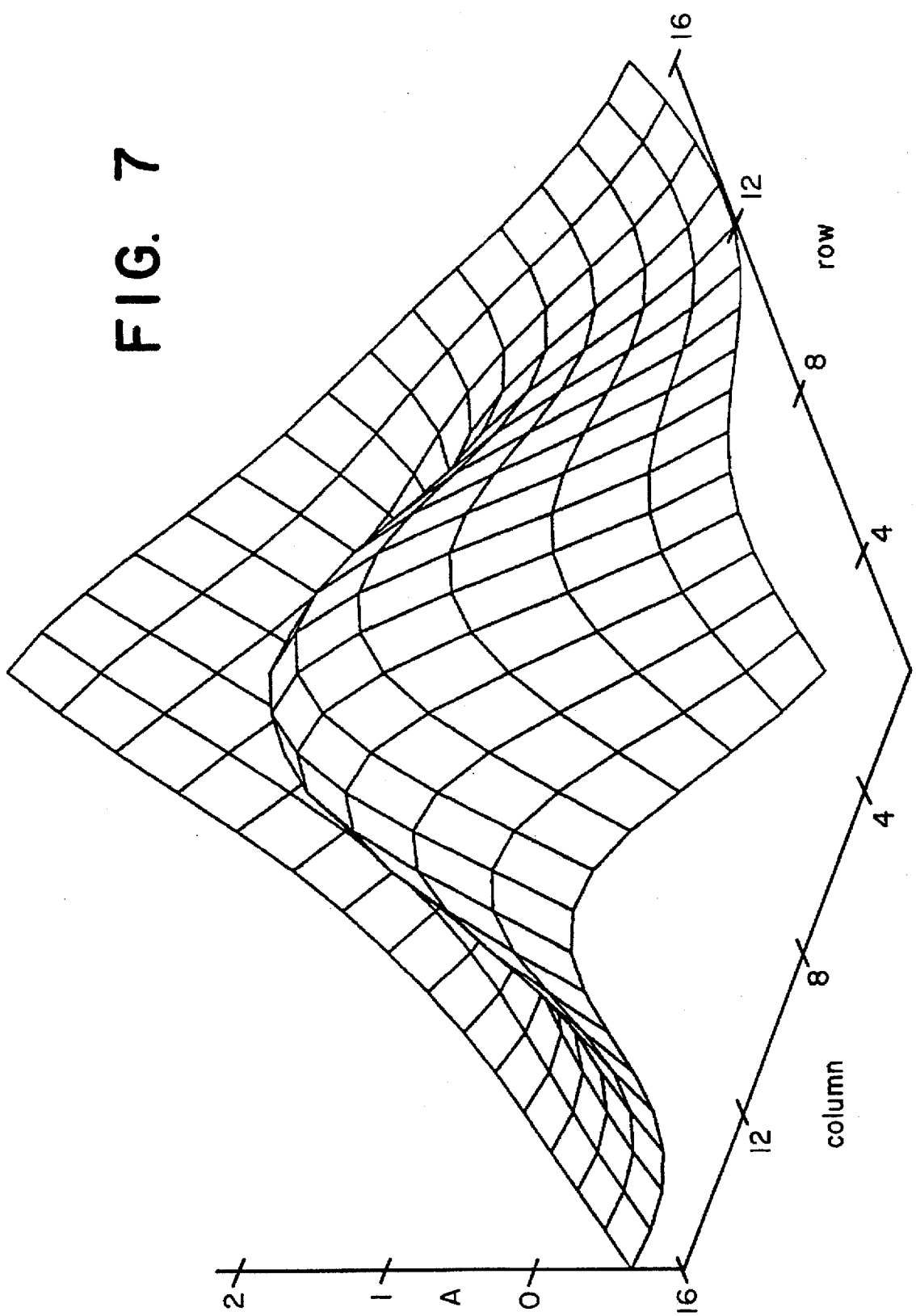
Figure 8:
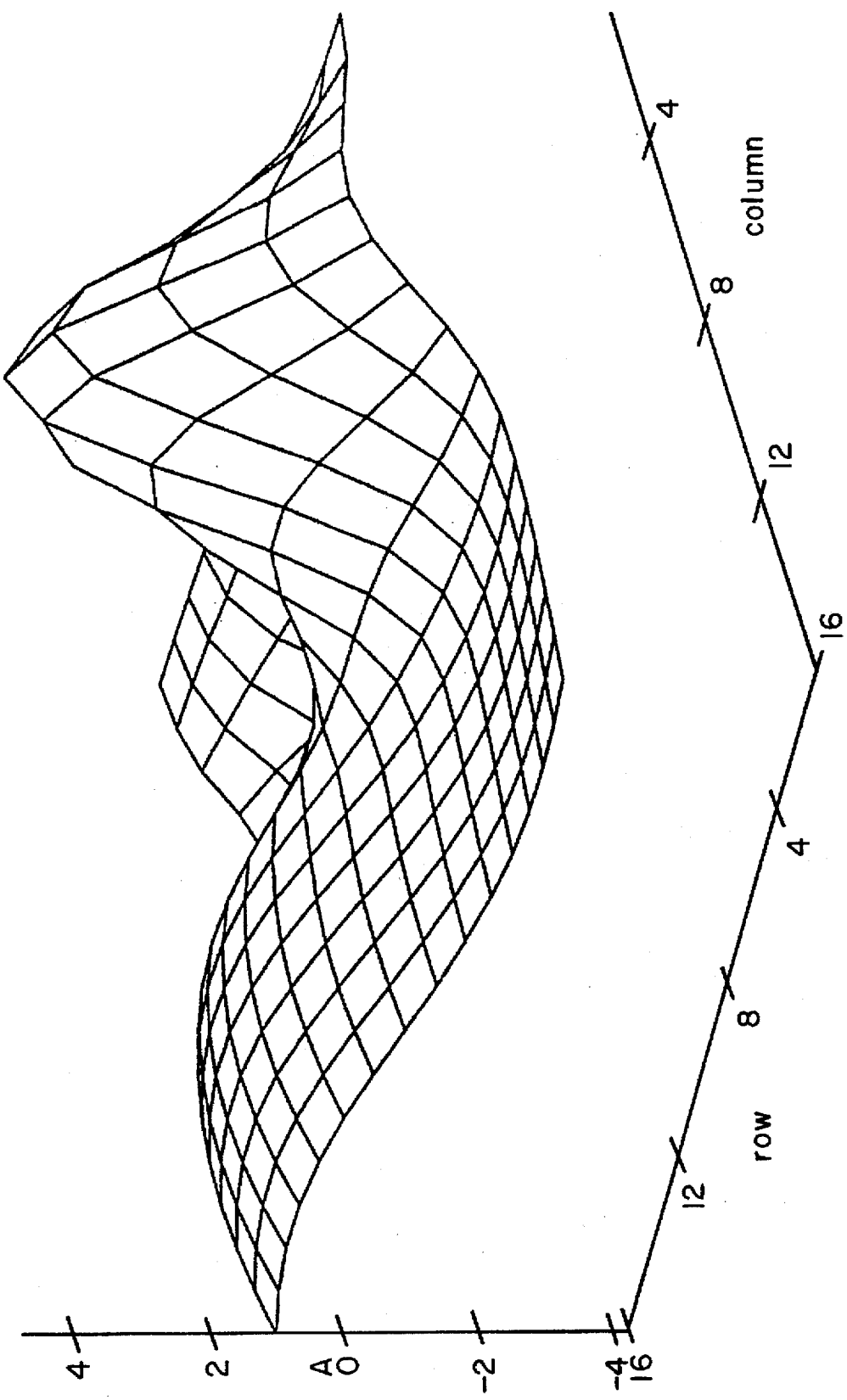
Figure 9:
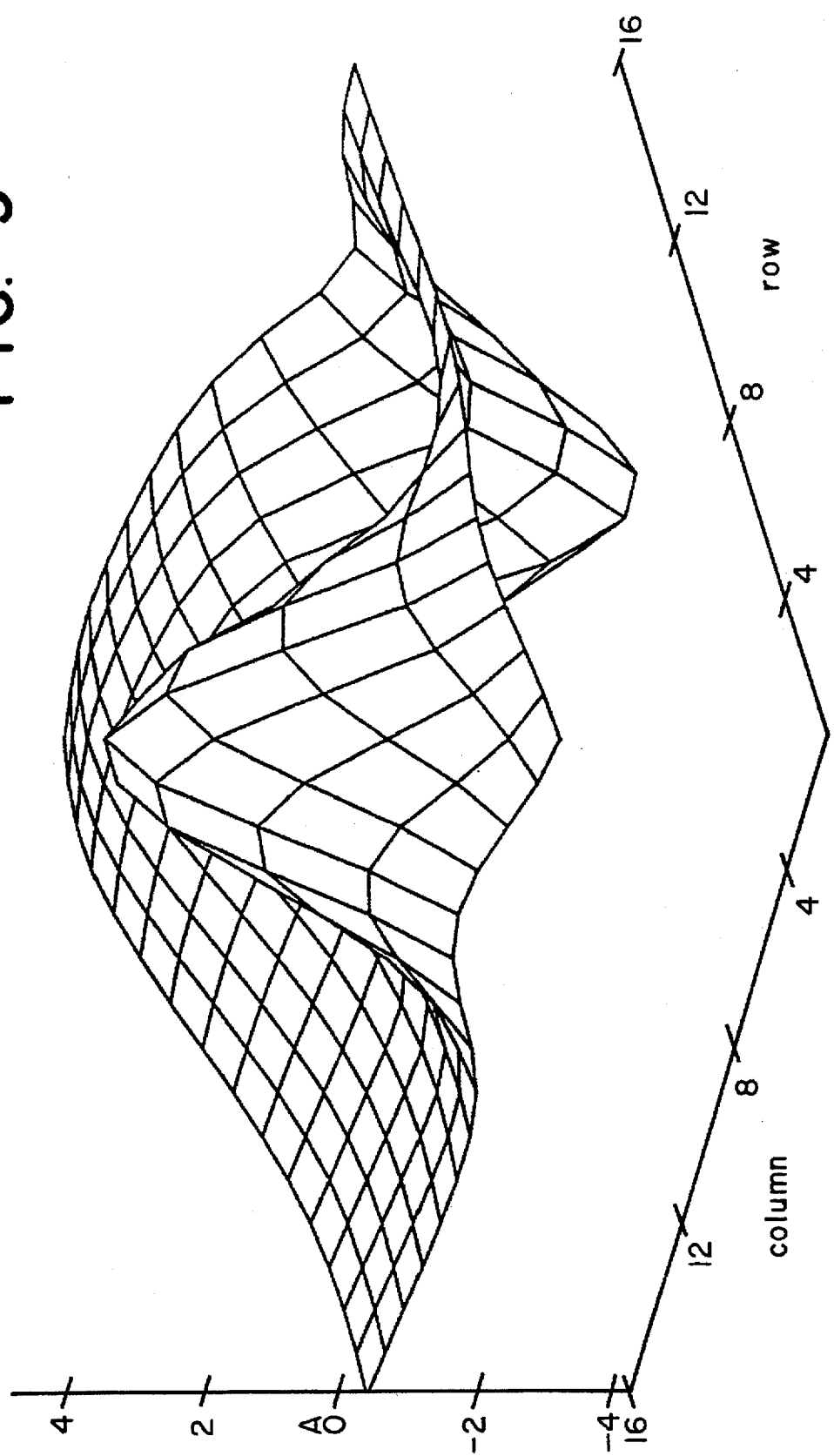
Figure 10:
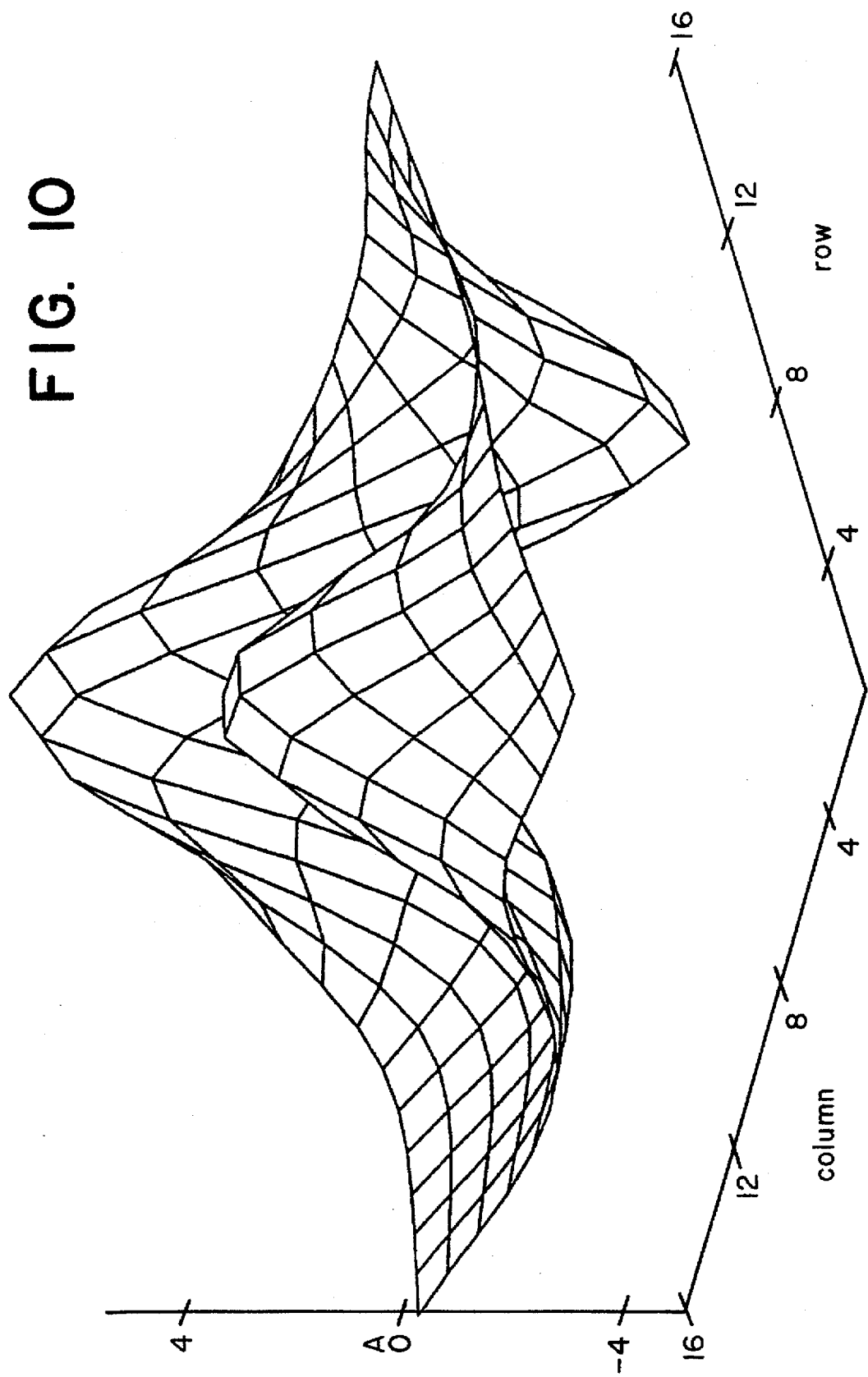
Figure 11:
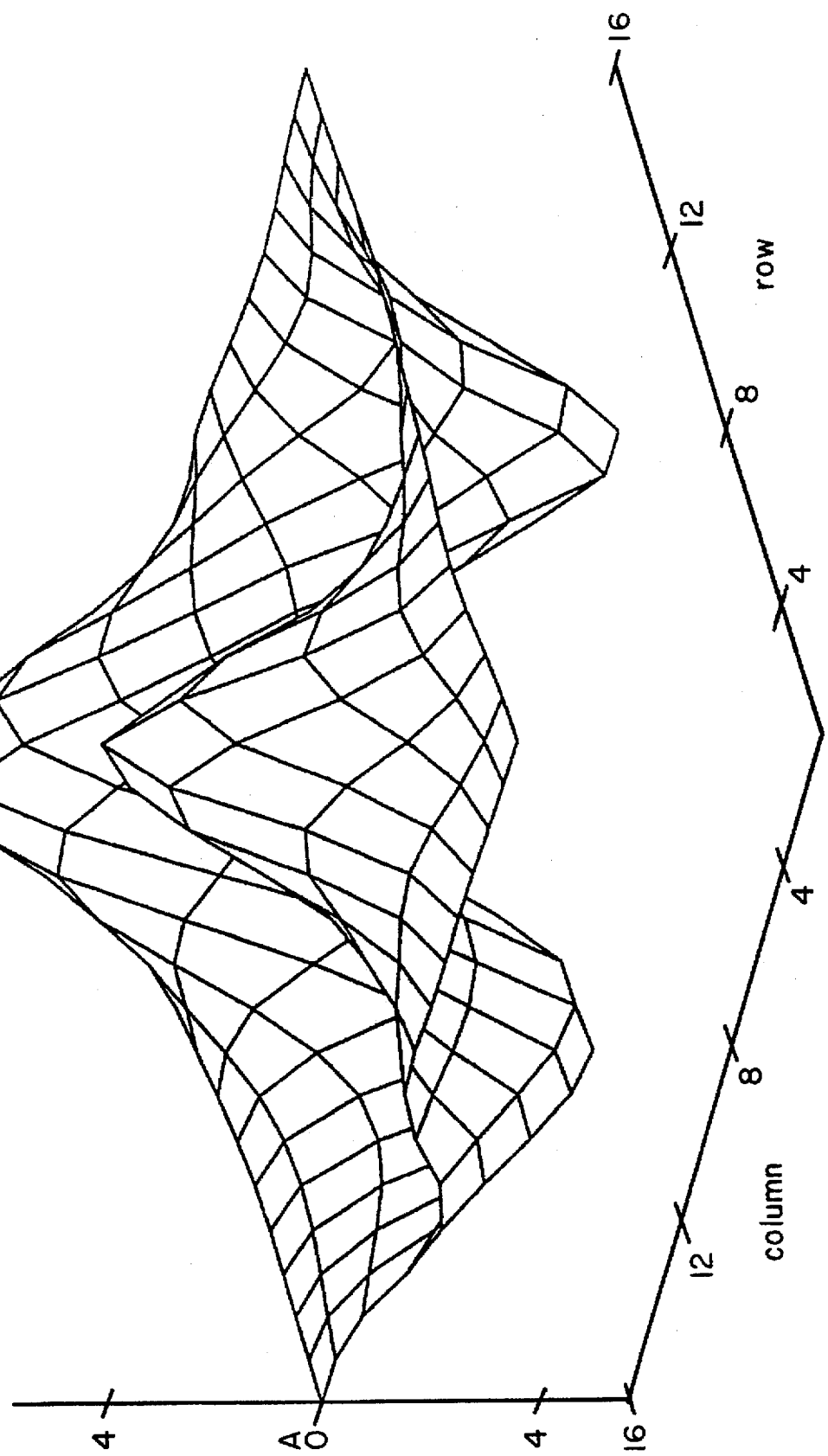

FIGS. 5, 5a to 12 show a computer simulation of the calculation of an approximation function by the adpative filter for the NOT (XOR)-function shown in FIG. 5. This NOT (XOR) function is additionally offset by adaptive noise as shown in FIG. 5a.

Figure 12:
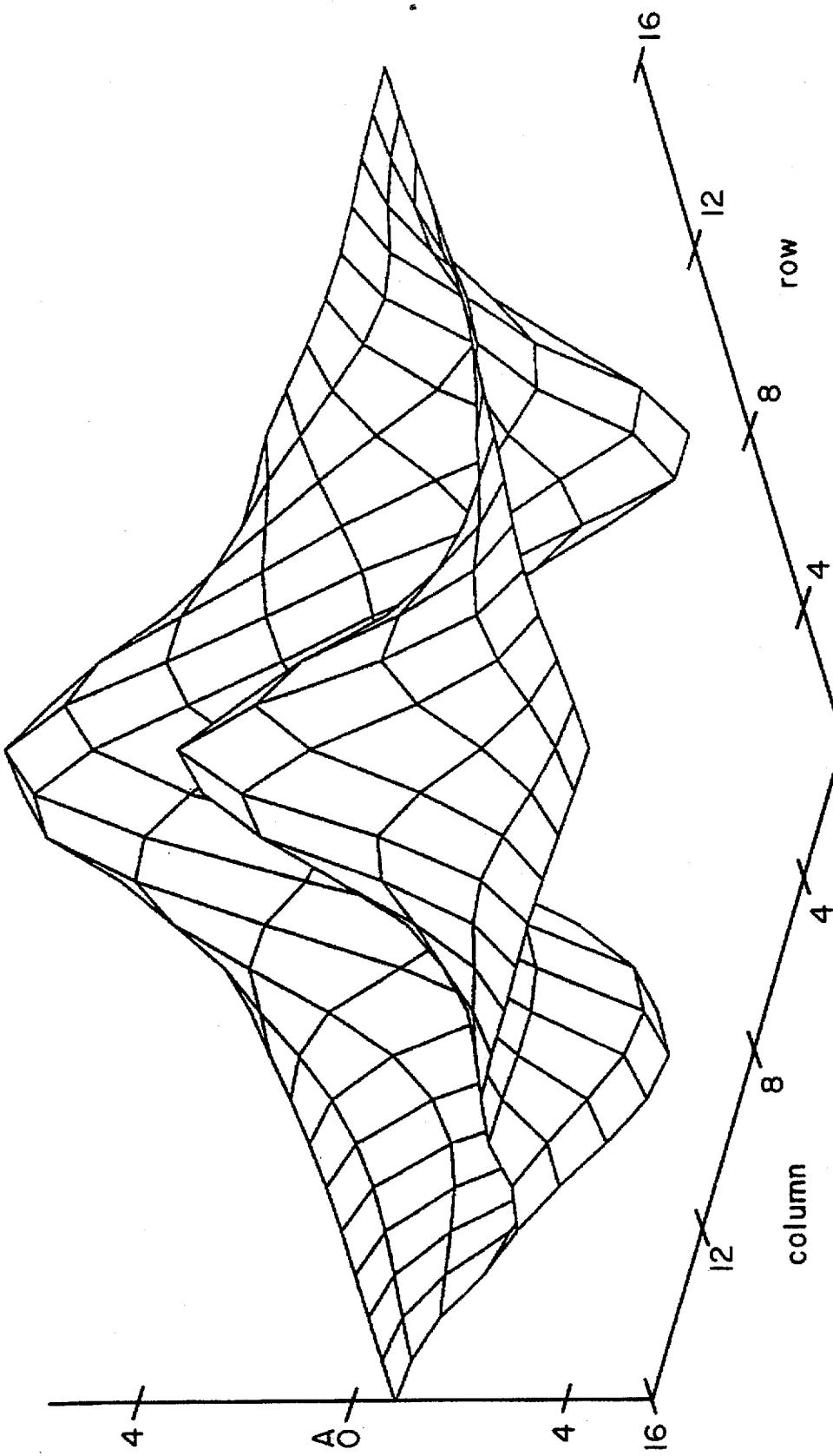

After a certain amount of calcualtion steps which are shown in FIG. 6 to 11, the filter automatically finds the approximated function shown in FIG. 12.

Although the rotation of the sub-space is only performed in regard to one dimension within FIG. 3, it should be obvious that the elementary filter may perform rotations in any dimensions, which of course leads to more complicated calculation methods for the minimization, which calculation methods are however, implementable without problems.

The minimization of difference D expressed by formula (2) between the set function and the currently approximated function expressed by the changeable filter parameters, which leads according to the above example to an orientation of the filters corresponding to the "mountain"-shape and which for example may be achieved by using a gradient fall method, may figuratively be understood as if forces would influence the filter, which bring these filters in the respective positions and shapes. The system will always try to reach the point of lowest energy, which corresponds to an optimal orientation of the filters.

FIG. 13 once again illustrates the most important relationships described above in form of a flow chart.

At 130 an input space or a function F to be approximated respectively is inputted into the adaptive filter. This function is projected onto the corresponding elementary filters by the filter set contained in Block 131, which comprises elementary filter functions as for example Gabor filters, "wavelets", "splines", Gaußfilters or polynoms, which may be either parametric or non-parametric, orthogonal or non-orthogonal. The thus obtained normal projections $A_g$ are forwarded to Block 132. Also the elementary filter functions are forwarded to this block.

In block 132 the contra-variant components according to the shown formula are calculated. Therefore, the contra-variant metric tensor is forwarded to Block 132, which has been calculated from the co-variant metric tensor according to common calculation methods as for example the gradient fall method or according to the Jakobi method.

The multiplication of the contra-variant components with its respective elementary filters (basis vectors) lead to the contra-variant components which together form projection A according to one of the two formulas stated in the last line of Block 132. This representation of the projection of the set function onto the spanned (defined) sub-space is forwarded to Block 134 in which the difference of the projection in regard to the set function is reduced with the help of energy minimization methods. The rotation of the elementary filters caused thereby is forwarded to Block 131, where the normal projections of the function F into the rotated sub-space is once again calculated and which is again carried out in the succeeding steps. After a certain amount of calulations, a minimaization energy is reached and the finally found projection A corresponds to the approximated function and maybe outputted by the adaptive filter.

A specific embodiment of the present invention already uses the first projection onto the sub-space as approximated function, leading to a considerable reduction of the calculation effort. Such a filter may be able to provide sufficent results in a very short time. More specifically such a filter will not only use one set of elementary filters spanning a first sub-space, but will use further sets of elementary filters which span further sub-spaces. In this case the projections of the set functions onto each of the spanned sub-spaces will be calculated and subsequent that projection will be used as an approximated function which shows a minimum difference towards the original function F. For the caluclation of the difference, once again the relationship according to formula 2 (respectively formula 2') is used. Such a filter is also very fast and particularly appropriate for realtime applications.

Figure 15B:
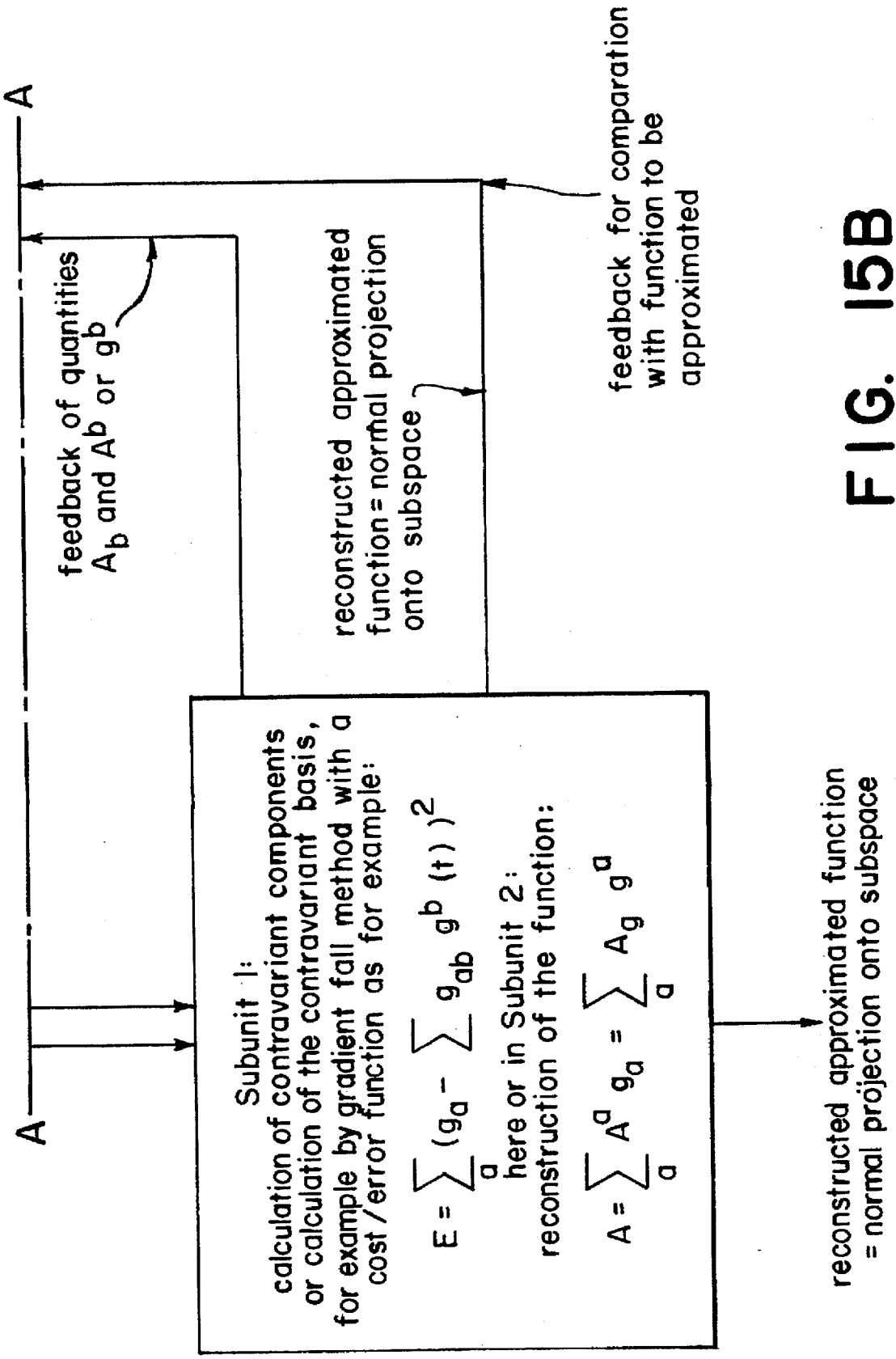

In FIG. 15, the most important relationships for a preferred filter structure which does not need to calulate the contra-variant metric tensor are shown, whereby this figure should be comprehensible alone from the respective labeling.

Further important elementary functions to be used in connection with the present invention are the following:

$$g_a\left(X_i, i \in \{1, \ldots, N\}\right) = \text{sigmoid}\left(\sum_i W_{ia} X_i + \theta\right) \quad (24)$$

wherein $W_{ia}$, $\theta$ are scalars, namely the corresponding parameters of the basis function $g_a$ and sigmoid(a)=This function is used in substantially 70% of all neuronal network applictions and is therefore of considerable importance for many applications.

A further function is the following:

$$g_a(X_i, i \in \{1, \ldots N\}) = \tanh(W_{ia} X_i + \theta) \quad (25)$$

with $\tanh(a) = \dfrac{e^{+a} - e^{-a}}{e^{+a} + e^{-a}}$ and $W_{ia}, \theta$ defined as above Once again it should be noted that besides the euclidic distance, also other distances are possible, as for example the Kullback-Leibler Entropie, the Manhatten-Distance, the Mahalanobis-Distance etc.

Further, it should be noted that it is sufficient to view just one space in which the examples for the set functions are located. In other words, it is sufficient to monitor the function to be approximated as a vector in the function space, whereby only one vector is monitored which is contained in the example space.

Further, it is sufficient to monitor the set function F and the method only for set input values, in regard to which also output examples are given, i.e. in other words, a calculation is carried out merely into those dimensions as corresponding to the sampling of the input function.

In some cases it might be useful to further change the reconsructed projection A by a function h, to approximate also difficult set-functions. In this case the minimized distance D can be written as:

$$D = \left(F - h \sum_a A^a g_a\right)^2 \qquad (26)$$
$$= \left(F - h\left(\sum_a A_a g^a\right)\right)^2$$

Further, it should be noted that if no analytical dependency of the basis function from the parameters is given, as it is for example the case with fractal functions, also another kind of determination of the dependency for example by minimization of a cost/error function of evaluation/heuristic is possible.

Further, s sigmoide, tanh or another function may be used for the projection, in that the reduced distance reads:

$$D = \left(F - h\left(\sum_a A^a g_a\right)\right)^2 \qquad (27)$$

wherein h (f) represents a function as for example sigmoide, tanh or another function.

Generally this may be expressed as follows:

$$D = f\left(F, h\left(\sum_a A_a g^a\right)\right) \qquad (28)$$
$$= f\left(F, h\left(\sum_a A^a g_a\right)\right)$$

Further, it should be noted, that another cost/error function E may be used, the minimization of which corresponds to the minimization of the distance D.

Important in regard to the present invention are also the following relationships:

Assuming proj $g^a$ is the projection of the basis function $g^a$ onto the plane spanned by the set function F and the respective basis function $g_a$, the minimization of the distance may be expressed as follows:

$$D = \left(F - \sum_a A_a g^a\right)^2 \qquad (29)$$

which compounds to the minimization of distance E $$E = \sum_a (\text{proj } g^a - g^a)^2$$

Similarly for the general distance it may be written:

$$E = \sum_a f(\text{proj } g^a, g^a) \qquad (30)$$

bzw.:
$$D = f(F, A^a g_a)$$

Finally it should be noted that the inventive filter may also be constructed in a hierarchic manner out of sub-filters. Each sub-filer corresponds to a basis function of the higher filter. Several sub-filters span in that case a sub-space.

In the following some application possibilities of the inventive adaptive filter will be discussed, whereby it should be emphasized that at least some of the applications shall add inventive particulars in addition to the adaptive filer itself.

The principle of one of the main application possibilities of the inventive adaptive filter concerns information reduction. Complicated signals may be approximated by a function provided by the filter, which function is represented by few scalars and filter parameters in a sufficient manner which representation is used for the further processing and for storing the function.

A further essential aspect for an application of the adaptive filter according to the present invention may be seen in the possibility to approximate an incomplete set function F by an approximated function, whereby this approximation leads to the same good result, as it is achieved by an approximation of a completely predetermined set function. The advantage for pattern recognition is evident.

If the adaptive filter is used within a device for texture classification, unkown textures are input into the filter, which are "learned" in the form of approximated functions according to the above-mentioned relationships. If an unknown texture is then inputted, that stored texture will provide the greatest output value, which is most similar to the unknown texture, whereby the unknown texture may be assigned to this class.

Besides the possibility to substantially reduce the bandwidth of a television picture with the adaptive filter according to the present invention, the inventive filter may also be used to filter motion vectors, for exmple in an application for HDTV. For such an application a moving object may be interpreted and stored in regard to several timely successive planes within a three-dimesional space with one-dimension being the time. In such a space a moving ball would describe a hose corresponding to the set function F. The adaptive filter will orientate its elementary filter (at last one) in accordance to the hose, whereby the speed of the motion of the ball may be determined by the tilt of the filter. Generally expressed, the adaptive filter may be used to detect the optical flow in each time-plane.

A further application concernes a device for stereo image processing: The filter detects each of the two stereo images by calculation of an approximated function and is able, due to the different orientation of the elementary filters for each of the images, to reconstruct the three-dimensional image.

If the inventive filter is used within a device for pattern recognition, respectively a method for pattern recognition respectively for pattern classification, the present invention provides the advantage that the texture, for example an image of a group of persons, may be recognized independently of its orientation. Thus, it is not necessary to "take a picture" of the group of persons under the same angle as it has been used for the textures (persons) in the preceding step of learning.

The inventive filter is able to compensate for the different orientations within the space by adjusting the elementary filters in the correct position and is therefore able to output the same approximated function although the used angles are different. Thereby, an unambiguous assignment of the persons to e be classified to a person within a group of previous "learned" persons is possible.

Several applications are related to control engineering: A control response detected by sensors, respectively a desired predetermined control response may be modeled by the filter, thereby naking it possible to electrically realize in a simple manner the desired control response which is now mathematically exactly described. The filter may also serve itself as the control unit, which provides the correct output value based on input values (X,Y in FIG. 1) according to the stored control response (memory 5 in FIG. 1). If the inventive adaptive filter is used in connection with a monitoring system or in connection with a monitoring method, an advantage can be seen in the fact that it is possible to still monitor an area monitored by several sensors, if one of the sensors (cameras) fails. The inventive filter will then adjust the remaining sensors in that a complete monitoring of the space under interest is possible.

The inventive filter is also reliable to a high degree since, as soon as the given elementary filter fails, the remaining elementary filters are adjusted in that an optimal approximation of the given set fuction is possible. The adjustment of the remaining elementary filters can be completely different compared to that case if no elementary filter fails. This compensation characteristic of the inventive adaptive filter leads to a plurality of applications, in particular also in aerospace engineering. Within the above given examples, the elementary filters were often supposed to be for example Gaussian functions. The term elementary filter has however, to be understood in a more abstract sense and could also mean a whole system, which in case of failure is substituted by the other elementary filters (the further systems).

Futher, with the inventive adaptive filter it is possible to build hierarchical databases in which symbols are not stored in the form of words but in the form of filter parameters and Scalars (normal projections).

For example, a tree may be represented symbolically by its crown, its trunk and its branches. Each of these portions may be stored as approximated function or in an hierarctical order within a database. If the input function comprises only a portion of a tree, for example the portion of the crown, first the crown is found within the database and by the hierarchical assignment the remaining components of the tree may be found.

Also the calculation of fractal dimensions is simplified by use of the inventive filter. If an image is applied to the filter and the filter is covered in such a manner that it calculates the fractal dimensions of the inputted image, the filter is then able to determine from an inputted grey level image the most similar image in regard to fractal dimensions.

Also the construction of a robot is possible in which the failure of an effector is compensated by the remaining effectors. For example the motion of a defective joint may be compensated by a compensation motion. In this case the filters constute also effectors which are able to compensate the defect of one (or several) filters in an optimal manner, so that the intended motion may still be carried out.

In the following the principles of the inventive adaptive filter are once again described with additional details and then further application possiblities are discussed, A calculation of the filter $g^i$ by other means, for example in an analytical manner without the use of a metric tensor, or by approximation with deterministic or stochastic minimization of an energy/cost function is explicitly covered by the present invention.

DETAILED DESCRIPTION

1) Normal Projection

The normal projection of the set function with each elementary filter $g^i$ is the Scalar product of the function with this filter, for discrete values this is the sum of all x of the product of the set function $I(x)$ with $g^i(x)$, and in case of continuous values this is the integral over all these product.

2) Matrix inversion

The necesssary contra-variant metric tensor is the inverted co-variant metric tensor: A matrix inversion has therefore to be carried out.

Thus in this regard, two methods are possible: first the so called Miller-Penrose Pseudo-Inverse, whereby the Eigenvectoren and the Eigenwerte are calculated by using the Jakobi-method: this method is based on the rotation of the matrix thus that the non-diagonal elements having the highest scales are vanished. his is done until only a sole diagonal element remains. method is advantageous in that the product of the calculated Eigenwerte is the determinant which is needed herein below.

In case of a continuous change of the input values, a calculation of the Eigenvectoren and of the Eigenwete through resonance as it is for example described in "Neurocomputing 2", Andersson Pellionizc, might be more appropriate, since then the convergence in regard to the new values would be reached rather fast, while the Jakobi-method starts each time from the beginning.

Also in the case of an increased amount of filters which require sensors with an increased number of dimensions there should more efficient methods available.

As a second method, a gradient fall method (gradient descent method) is applied:

A definition of the inverse is the following:

$$M \times Inverse(M) = E$$

wherein M is the Matrix, Inverse(M) is the inverted Matrix and E is the unit matrix.

If a system with the following energy- or cost- function is defined:

$$(M \times Inverse(M) - E) \times (M \times Inverse(M) - E$$

wherein the elements of the matrix inverse (M) are the unknown quantities, these unknown quantities could be calculated according to the gradient descent (fall) method. The system will try to minimize the above difference in order to calculate the unknown quantities.

3) The calulation of the dependency of the projections onto the total sub-space of the parameters from the elementary filters requires some differential operations, which are all relatively classical. Additionally the following fine details should be noted:

A required quantity is a differentiation of each element of the contra-variant metric tensor in regard to each element of the co-variant metric tensor:

The following formula is used for this purpose $$a(i,j) = A(j,i)/G$$

This formula is classical:

$a(i,j)$ is the element in the i-th row and the j-th column of the inverted matrix, thus also of the contra-variant metric tensor, G is the determinant of the co-variant metric tensor. The calulation is, as mentioned under item 2) above in an analytical manner possible.

$A(j,i)$ is the so called algebraical complement to the element $b(j,i)$ of the co-variant metric tensor. This complement is formed by cancelling the j-th row and the i-th column of the co-variant metric tensor forming the determinant of the remaining system and multiplying it with $-1^{j+i}$. Thus a formula is available giving the relationship between each element a of the contra-variant metric tensor and each element b of the co-variant metric tensor and thus it is possible to differentiate each element a along to each element b.

The calculation of the remaining quantities by differential operation is carried out according to conventional method.

The total change of each parameter of the elementary filters necessary for reducing the difference between the projections and the set function is claculated by a) calculating for each dimension x the dependency of the difference from each of the parameters:

b) calculating therefrom the memory change in that the difference in dimension becomes smaller;

c) calculating finally the total change by summing all changes. In item c) euclidic parameter spaces have been assumed, however, also non-euclidic parameter spaces are possible. In this case different characters for the difference have to be applied and therefore also different summing operations.

Also different input spaces which are non-euclidic like, for example, a spherical surface.

Besides the gradient fall method, also methods as for example Simulated healing or Main Field Annealing or other methods as for example Graduated Non-Convexity (Blake & Zisserman, visual Reconstruction) or even other corrected energy functions, as for example Phi-functions (Geman and Geman) may be applied if the difference between the projections and the set function respectively the formed energy function in the parameter space posesses several local minimas.

Applications in the Field of Image Processing

Texture Classification

Each filter "learns" a texture. If the unknown texture is inputted to each filter, each filter will output an output value. That filter which stores the texture most similar to the unknown quantity, will output the biggest output value, thus enabling to assign the texture to this class.

Calculating the Optical Flow

A sequence of images is applied to the filter, which will be recognized by the filter as a three-dimensional function. The filter calculates the output value in a manner so that the output constitutes for each pixel of the sequence of input images the optical flow at the respective location.

Calculation of Fractal Dimensions

An image is applied to the filter and the filters are coupled in such, that the filter calculates the fractal dimension of the input image. The filter is then able to detect from an inputted grey level image the most similar image having the same fractal dimension.

Stereo Image Processing

One of the two images is applied to the filter and the filter "learns" the image. If the other image is applied to the filter afterwards, the filter is able to detect a three dimensional image of the image content from the displacement of the sub-filters.

Pattern Recognition

Analog to texture recognition; may be carried out also three-dimensional for example for recognizing faces independent of their positions: The herefore used elementary filters are filters in a three-dimensional space and they are arbitrary. In the present case, for example, three dimesional Garbor filters are possible which are arranged in that the surface of the face is optimally represented. The filters become therefore relatively flat.

Principally, in connection with all classification tasks, also an amount of set functions is possible, which amount is smaller as the amount of the classes, in an extreme case equal to one. This set function(s) is (are) a function (s) of the set functions of each class or of other necessary quantities for the differentiation of the classes. This is of importance where the amount of classes is substantial, as for example in an application for face recognition where sub-decisions, as for example for the comparison of certain face portions lead to an acceleration of the decision, to a more secure decision, a reduced amount of memory space and/or to optimization the method in other directions. Possibly the said function may also be the difference between the two patterns/classes.

Control Engineering

Examples of a desired control response is applied to the filter in form of sets of input values constituting desired output values. The filter calculates from these examples the desired general control response. Examples of the responses of an unknown system are applied to the filter in the form of sets of input values with corresponding output values. The filter detects from these quantities the general response of the unknown system.

Stochastical Systems

The inputted set function may also be a probability distribution or a histogram, in that the filter may also model a stochastic system or substitute a system; Since the filter is dynamic, it may also follow a time variant histogram distribution. In a realtime application, this is an alternative to the modelling of probabity distributions under use of Fischer Information Metrics, for example, of the minimization of the Kullback-Leiber Entrophie upon which the above metric is based. Thus the filter may substitute time consuming stochastical learning systems, as for example the Bolzmann-Machine from Hinton & Sejnovski (Rumelhar and MacClelanfd, Parellel distributed Processing, the MIT-press). The use of such or similar information theoretic metrics/standards for the calculation or definition of the difference is however possible.

If after minimization the difference is still too big, further elementary filters of arbitrary type may be added or may substitute the filters until the difference for each application is sufficiently small. The system will then not start in time consumingly-manner from the beginning, but will base further calculations on the already achieved results. It is also possible to cancel filters if the requirements are lower than defined in the beginning. Further, in case that one or several elementary filters fail, the system will calculate the parameters of the remaining filters again in that these remaining filters are arranged in as optimal fashion in order to compensate the failed filters as good as possible.

Ecomomy

Time functions form the past are applied to the filter, for example, stock markets prices. The filter will then, after all prices which are important for the future have been input, calculate the most probable future prices from the prices of the recent past.

Aeronautical Egnineering

Since the filter always carries out the best calculation possible with the given elementary filters, in case of failure of the one or more filters, the remaining filters will compensate this failure as good as possible. Thus the filter compensates the failure of a certain sub-system, namely of a plurality of elementary filters within certain bounderies (known as Graceful Degredation).

Data Storage

A total system comprising several hierarchical ordered filters "learns" for example visual inputted objects, sub-divides these objects into sub-objects, (also in an hierarchical manner), and stores them subsequently in accordance with a detected geometrical or in accordance with other relationship within a memory. Also non-geometrical or non-spatial relationships may be used, as far as they may be transferred into geometrical relationships. These enable the user, for example to mention corresponding terms to an inputted term, as for example related terms, subordinate terms and superordinated terms. If the user assigns a different structure to a set of terms as another user, the system may map the respective structure and provide each user with his structure for an optimal data search. From the mapped structure conclusions on the respective user are possible.

Calculations

If the structure of a total result to be calculated is of such a kind that it may be represented as a geometrical object out of functions of several independent calculations, the filter may also be used for the calculation of these quantities.

If the object is as image dividable into several single objects (for example a tree into a crown and a trunk), one of the filters may detect a sub-object according to its luminance distribution as the set function, forward this information towards a superordinated total system, in response to which the total system selects other filters necessary for the recognition of the other individual objects (for example the filter which reacts optimal for crowns of a tree, notifies this to the system TREE to which it belongs; this system selects a filter which reacts optimal onto trunks, in that this filter may search below the crown for the trunk; if the filter detects the trunk, it will notify this to the subordinates system TREE which now may notify TREE IN IMAGE FOUND).

Self-evidently, the filter may also belong to several total systems, for example, the filter WHEEL may belong the total system BICYCLE and to the total system MOTORCYCLE, or the total system may possess several alternative sub-filters, for example system TREE may possess sub-systems CROWN-CIRCULAR and CROWN-CONICAL, for example for conifers. Therefore, evidently all these filters may also be structured hierarchical, for example, TWIG-BRANCH-CROWN-TREE-WOOD.

When a filter has learnt said function it is also possible to vary the parameters within the certain ranges, for example, the parameters may be multiplied with a common coefficient, to compensate for distance variations, or to admit distortions to enable different angles of vision; calculations for example of projective geometric.

As a measure for the distance between a projection and a set function, the Kullback-Leibler-Entropie or another information theoretical-maesure may be used.

Object Detection/Tracking

A filter, respectively a system comprising several filters is able to differentiate several objects, for example on a radar screen or a television screen and these objects may also partly overlap each nother. As mentioned above, the citeria for distinguishing are arbitrary functions of the parameter values of the elementary filters and are therefore functions of a luminance brightness distribution or of an equivalent thereof. The system is then in a position to follow each of these objects, to assign a label, to identify the object, and also to control one or serveral sensors (cameras, target radar etc.), to follow the objects and to cause further measures of the total system, as for example an alarm. Self-evidently, in case that respective set functions have been learned, predictions on future behaviour as for example a future trajector characteristic, danger of collision etc. may be made.

The filter is also able to detect abormalities in the movement of a patient if certain movement sequences are typical for such abnormalities (classification of blood cells are applications belonging to the above-mentioned texture classification).

Applications in th Field of Artificial Intelligence

The filter may be employed in plural forms in the area of AI as already shown above for the field of object detection.

Object Detection/Pattern Recognition

The filter will be able to recognize an object, even if this object is partially covered, whereby the degree of the covering tolerable depends from the specific case. Further, if the filter TREE CROWN provides an ambiguous result, the subordinate filter TREE may be called to select the filter TREE TRUNK in order to find, the TRUNK, below the CROWN. If the TRUNK is found, the result of the filter TREE CROWN is verified and if not, this result is distorted.

Thus appliance of hierarchical filter structures leads to a maximal possible use of available redudance, whereby the available redundance may also be found with the help of such a filter.

If the filter learns an object and it is determined that the parameters of the elementary filters may be grouped in a certain manner after the learning, for example filters with much overlapping are grouped or filters with certain frequencies or relationships between the parameters, as for example constant distances are grouped, concepts may be assigned to these groups which correspond to respective objects of the outer world: For example, TREE CROWN has another fractal dimension and another position as TREE TRUNK, in that the filter is able to separate the elementary filter belonging to these objects and to assign them to different objects and to determine the relationship of the two objects and to learn them.

This may evidently again be carried out through several hierarchical-levels possible as for example in the case of WOOD-TREES-TREE CROWN-BRANCH-TWIG-LEAVES. The filter may also use other critera as for example, phase jumps at the same location or classical contour detection algorithms to separate sub-objects from each other. The filter will then store the objects together with the corresponding parameter values, and the spatial relationship in regard to each other and will then be able to anlayze and to learn its surrounding and to submit criteria for the behaviour to the superordinated system. This is for example, of interest if the total system is an unstaffed robot vehicle which is used on unknown territory, where it is not possible for the designers to detect beforehand the surrounding and the objects with which the robot vehicle is faced after landing.

For example, by a preselection of the elementary filter it is possible, to program the filter such that it responds preferentially to certain objects of its surroundings and that it selects its set function by itself. These could for example, be objects which are moving while other static objects are ignored. Principally, all objects may be selected which have selection criteria that might be expressed by functions of filter parameters as for example by certain motion patterns, motion sequences, luminance distributions, textures structures, etc. Also after the learning of the set fuction, such a selection may be conducted as for example in case of rescue robots in nuclear power stations and with forest fires or for monitor robots.

If the camera is directed onto the robot vehicle, it learns its own outer strcture and would therefore be able to determine damage from outside by comparing the outer structure with the learnt structure, and by notifying this to their superordinated system and then to instruct further measures as for example the removal of a cover for further analysis or certain repair operations. The system would further be able to determine the exact location of the damage by successively descending through several hierarchical filter planes, to determine the kind of damage by comparing it with an internal texture database and to thus cause the total system to provide further specific measures.

Generally, the filter is invarient against rotation, translation and/or scaling if one proceeds as follows: Once the filter has determined the set function/the object and the pattern to be recognized is applied to the filter, the filter is caused to rotate, to shift or to change its magnitude in regard to the image, i.e. it is tried to minimize the difference between the projection and the image, whereby only a rotation, a displacement or a scaling of the total filter is allowed.

Evidently, as already mentioned above, it is also possible to allow certain changes of the parameter values of the single filters, if it is tried to be invariant against certain distortions.

Stereo Image Processing

With the filter it is further possible to generate fractal disparity maps as they may, for example, serve for the three-dimensional reconstrction of fractal objects as for example of a bush.

Image Synthesis/Graphic/CAD/CAM

If the characteristic parameters of an object have been learnt, as for example that of a woman's hair, it is possible to generate arbitarily, synthetic images, to alienate them, change them, distort them, recombine them and compose them. One can also conduct graphic animation in an extremely short time with extremely high quality, since not each pixel of the image has to be manipulated but only the parameter values of the assigned elementary filters.

Image Compression

The single filter enables an image compression in the range of 80 to 100:1. By compressing image sequences of similar content, this ratio further increases, since in that case, only changes of the parameter values have to be transmitted. Evidently the compensation may also be optimized by use of three-dimensional elementary filters.

Further Application Possibilities

The filter may also be used to filter known structures as well as combinations/functions out of an input space, in order to leave merely those structures which are new or unknown.

Applications in this regard may be found in the field of speech recognition of phonemes, in the recognition of regularities and for the identification of speakers.

The general solution of an optimization tasks, as for example the design and the management of spatially separated systems, of radio cells for a mobile network, of power stations, transfomers and distributers of an energy network, of depots of a transport company is possible in the following manner: to each network node an elementary filter is assigned, for example, a Gaussian filter with a variable average value, whereas the standard deviation of each filter may only be changed with a common scale. The elementary filters are arranged such, that a given space as for example, the Federal Republic of Germany, is covered in an optimal manner; if one node fails, the remaining nodes are reorganized in that the space is again optimally covered; this may by achieved in case of a radio node in that the standard deviation which models the radio power, is increased for certain elementary filters: Radio cells are generally not mobile and may therefore not change their position.

Evidently, also distortions of the underlying metric in such optimizing tasks may be considered; if distances are defined according to their transport times, depots in the neighborhood of highways have bigger supply areas: These distortions may be modelled by distortions of the input space respectively by distortions of the filter parameters.

Further Application Possibilities

Data/sensor-fusion

If the different sensors/information sources cover overlapping areas as for example in the case of infrared-images and images in the visual frequency range of the same open country, in case of failure of one sensor the parameters of the one or of the several further sensors may be changed in a manner that the area to be monitored is covered as well as possible and further, the filter may detect the underlying statistical relations of data from different sources and model same.

If the amount of elementary filters is too big for a certain application, in that the necessary calculations are time consuming and/or complicated, elementary filters may be grouped arbitarily, then the total projection of the grouped filters is calculated and the groups may be assumed to be higher elementary filters having a new metric tensor which expresses the relations of the groups; this can also be done in a successive and hierarchical manner. In this case, no concept of the corresponding object is assigned to each group.

If the set function in certain applications is varied, under certain circumstances it might be recommendable to implement the elementary filters in a recursive fashion.

Stereo Image Processing

Besides the proposed methods it is further possible to consider both images as reproductions of the same three-dimensional space and to base the set function and the calulation hereon as for example by use of three-dimesional Gabor filters. The parameter space may be non-euclidic, respectively non-cartesian, in which case the necessary changes of the parameter values are not independent but coupled via another metric tensor. In this case the coupling has to be considered for the calculations. Also the input space does not have to be euclidic, respectively the coordinate system does not have to be cartesian. For example, it is possible to have a set function which relates to the coordinates of a spherical surface as for example with navigation tasks in aeronautics or of other noneuclidic basics as for example in case of calculations/analysis of radar data in connection with experiments in the field of relativity theory, or in case of analysis of data of medical image processing etc.

I claim:

1. An adaptive filter whose output characteristics correspond to the sum of the characteristics of a plurality of elementary filters comprising:

a first memory for storing sets of m input signals and m wanted output signals, with m an integer $\geq 1$, said m wanted output signals defining together an Fm vector, and representing a function (F) of said input signals to be approximated, with said function defining a function space;

a second memory containing modifiable parameters;

filter calculation means cooperating with said second memory, for defining therewith n elementary filters, where n is an integer $\geq 1$ and i has all of the n possible values, the elementary filters spanning a sub-space in the function space;

intermediate calculating means comprising:
i) means for applying said m input signals to said filter calculation means thereby obtaining nm values, with each one $g_i$ of the n elementary filters delivering m outputs arranged as an m-component filter vector $g_i$;
ii) n scalar multiplication means for multiplying each of the m-component filter vectors $g_i$ with the Fm vector to obtain n resulting quantities representing the normal projections of the vector Fm onto the respective vectors $g_i$, said resulting scalar multiplication quantities together forming an n-component vector $A_i$ of normal projection;

iii) linear algebraic calculation means receiving said filter vectors $g_i$ and said vector $A_i$ of normal projection for calculating therefrom intermediate results representing the projection of the function (F) to be approximated on said spanned sub-space in the function space;

a third memory for storing said intermediate results of said intermediate calculating means;

calculating means cooperating with the first and third memories for calculating the difference D between the function (F) to be approximated and a corresponding recombination of said intermediate results of said intermediate calculating means; and minimization means, responsive to the output of said calculating means for changing said modifiable parameters in accordance with one of a deterministic and a stockastic calculation method;

whereby the desired approximated function (F) is obtained at said output of the filter, from the superimposition of the elementary filters adjusted by the minimization in accordance with the intermediate results of said intermediate calculating means.

2. Apparatus according to claim 1 wherein said linear algebraic calculation means comprises:

means for calculating auxiliary quantities from pairs $g_a$, $g_b$ of said filter vectors $g_i$ in accordance with a selected scheme, said auxiliary quantities representing the components of a contravariant metric tensor $G_{ab}$, and means for multiplying the vector $A_i$ of normal projections with the contravariant metric tensor $G_{ab}$, thereby obtaining said intermediate results, said selected scheme being such that said intermediate results represent the projection of the function (F) to be approximated on the spanned sub-space.

3. An adaptive filter according to claim 1, in which a plurality of elementary filter sets is provided, each of which filter sets spans a different sub-space and wherein the projection of the set function (F) onto each of these sub-spaces being the approximated function which has the minimal difference D towards the filter set function (F).

4. An adaptive filter according to claim 3, herein the difference D is determined according to the formula:

$$D = |F - \sum_a \sum_b A_a g^{ab} - g_b|$$

5. An adaptive filter according to claim 1 wherein the elementary filter is a Gauβ function having the parameters of standard deviation and average value.

6. An adaptive filter according to claim 1, wherein the elementary filter is a Garbor function having the parameters standard deviation, average value, phase and frequency.

7. An adaptive filter according to claim 1, wherein the elementary filter corresponds to the function:

$$g_c(X_i; i \in \{1, \ldots N\}) = \text{sigmoid}\left(\sum_i w_{i\omega} X_i + \theta\right)$$

8. An adaptive filter according to one claim 1, wherein the elementary filter corresponds to the function:

$$g_c(X_i; i \in \{1, \ldots N\}) = \tanh\left(\sum_i w_{i\omega} X_i + \theta\right)$$

9. An adaptive filter according to claim 1, wherein the elementary filters linearly independent from each other.

10. An adaptive filter according to claim 1, wherein the set function F is read in discretely in regard to the range of values as well as in regard to the resolution.

11. An adaptive filter according to claim 1, wherein the found parameter adjustment is outputted.

12. An adaptive filter according to claim 1, wherein the set function is approximated at locations which have been incompletely detected by adjacent set function values and by additionally for example gaussian distributed noise.

13. An adaptive filter according to claim 1 wherein the used calculation method is the gradient fall method (gradient descent method) (deterministic).

14. An adaptive filter according to claim 1 wherein the set function F is an optical signal.

15. An adaptive filter according to claim 1 wherein the set function F is a video signal.

16. An adaptive filter according to claim 1 wherein the elementary filter is an optical filter.

17. An adaptive filter according to claim 1, wherein the set function is an audio signal.

18. An adaptive filter according to claim 1 wherein, the approximated function is transmitted as part of a HDTV signal reduced in bandwidth.

* * * * *

UNITED STATES PATENT AND TRADEMARK OFFICE
CERTIFICATE OF CORRECTION

PATENT NO. : 5,673,213
DATED : September 30, 1997
INVENTOR(S) : Konrad Michael WEIGL It is certified that error appears in the above-identified patent and that said Letters Patent is hereby corrected as shown below:

Title page, [76], Inventor, change "Friedenspromenada" to --Friedenspromenade--.

Signed and Sealed this

Twenty-fourth Day of February, 1998

Attest:

BRUCE LEHMAN

*Attesting Officer*  *Commissioner of Patents and Trademarks*